(12) United States Patent
Uchino et al.

(10) Patent No.: US 10,513,430 B2
(45) Date of Patent: Dec. 24, 2019

(54) SEMICONDUCTOR DEVICE

(71) Applicant: SUMITOMO PRECISION PRODUCTS CO., LTD., Hyogo (JP)

(72) Inventors: Ryohei Uchino, Hyogo (JP); Gen Matsuoka, Hyogo (JP)

(73) Assignee: SUMITOMO PRECISION PRODUCTS CO., LTD., Hyogo (JP)

( * ) Notice: Subject to any disclaimer, the term of this patent is extended or adjusted under 35 U.S.C. 154(b) by 734 days.

(21) Appl. No.: 15/077,105

(22) Filed: Mar. 22, 2016

(65) Prior Publication Data

US 2016/0202473 A1 Jul. 14, 2016

Related U.S. Application Data

(63) Continuation of application No. PCT/JP2014/005610, filed on Nov. 7, 2014.

(30) Foreign Application Priority Data

Nov. 7, 2013 (JP) .................................. 2013-231045

(51) Int. Cl.
  *B81C 1/00* (2006.01)
  *B81B 3/00* (2006.01)
  *G02B 26/08* (2006.01)

(52) U.S. Cl.
  CPC ........ *B81C 1/00492* (2013.01); *B81B 3/0086* (2013.01); *B81C 1/00404* (2013.01);
  (Continued)

(58) Field of Classification Search
  CPC ............ B81C 1/00388; B81C 1/00404; B81C 1/00436; B81C 1/00444; B81C 1/00492;
  (Continued)

(56) References Cited

U.S. PATENT DOCUMENTS

2002/0063339 A1* 5/2002 Sun ............................... 257/773
2006/0180883 A1 8/2006 Kouma et al.
(Continued)

FOREIGN PATENT DOCUMENTS

JP 2006-224224 A 8/2006
JP 2008-083122 A 4/2008
(Continued)

OTHER PUBLICATIONS

International Search Report for corresponding International Application No. PCT/JP2014/005610 dated Dec. 16, 2014.
Form PCT/ISA/237 for corresponding International Application No. PCT/JP2014/005610 dated Dec. 16, 2014.

*Primary Examiner* — Thomas K Pham
*Assistant Examiner* — Ibrahima Diedhiou
(74) *Attorney, Agent, or Firm* — Renner, Otto, Boisselle and Sklar, LLP

(57) ABSTRACT

A mirror device includes a frame body, a mirror configured to tilt about a Y-axis with respect to the frame body, a fixed inner comb electrode including a plurality of electrode fingers arranged in the arrangement direction along the Y-axis and provided at the frame body, and a movable inner comb electrode including a plurality of electrode fingers arranged in the arrangement direction and provided at the mirror, the electrodes fingers of the fixed inner comb electrode and the movable inner comb electrode being alternately arranged. The mirror includes a mirror body and an extension extending from the mirror body. Some of the electrode fingers of the movable inner comb electrode are provided at the mirror body, and another electrode fingers of the movable inner comb electrode are provided at the extension.

9 Claims, 15 Drawing Sheets

(52) U.S. Cl.
CPC ...... *B81C 1/00603* (2013.01); *G02B 26/0841* (2013.01); *B81B 2201/042* (2013.01); *B81B 2203/0136* (2013.01); *B81C 2201/0102* (2013.01); *B81C 2201/0132* (2013.01); *B81C 2201/0198* (2013.01)

(58) Field of Classification Search
CPC ............ B81C 1/00555; B81C 1/00603; B81C 2201/00; B81C 2201/01; B81C 2201/0101; B81C 2201/0102; B81C 2201/0128; B81C 2201/013; B81C 2201/0132; B81C 2201/0198; B81B 3/00; B81B 3/0064; B81B 3/0086; B81B 2201/00; B81B 2201/04; B81B 2201/042; B81B 2203/00; B81B 2203/01; B81B 2203/0136; G02B 26/00; G02B 26/08; G02B 26/0816; G02B 26/0833; G02B 26/0841; H02N 1/008
USPC ......... 359/196.1, 200.6, 201.2, 213.1, 221.2, 359/223.1, 295
See application file for complete search history.

(56) References Cited

U.S. PATENT DOCUMENTS

| | | |
|---|---|---|
| 2008/0130077 A1 | 6/2008 | Park et al. |
| 2008/0247029 A1 | 10/2008 | Zhou |
| 2008/0284279 A1 | 11/2008 | Obi |
| 2010/0103492 A1 | 4/2010 | Maruyama et al. |
| 2012/0099176 A1* | 4/2012 | Zhou .................. G02B 26/0841 359/291 |
| 2012/0307211 A1 | 12/2012 | Hofmann et al. |

FOREIGN PATENT DOCUMENTS

| | | |
|---|---|---|
| JP | 2008-139886 A | 6/2008 |
| JP | 2009-003429 A | 1/2009 |
| JP | 2009-175611 A | 8/2009 |
| JP | 2010-107628 A | 5/2010 |
| JP | 2010-525377 A | 7/2010 |
| JP | 2013-513828 A | 4/2013 |

* cited by examiner

SEMICONDUCTOR DEVICE

CROSS-REFERENCE TO RELATED APPLICATIONS

This is a continuation of International Application No. PCT/JP2014/005610 filed on Nov. 7, 2014, which claims priority to Japanese Patent Application No. 2013-231045 filed on Nov. 7, 2013. The entire disclosures of these applications are incorporated by reference herein.

BACKGROUND

The technique disclosed herein relates to a semiconductor device.

Patent Document 1 (Japanese Unexamined Patent Publication No. 2010-107628) discloses an MEMS mirror. The MEMS mirror includes a mirror, a spring, a movable comb electrode, a fixed comb electrode, etc., and is formed of a substrate with a plurality of silicon layers.

In the MEMS mirror, the mirror is driven by electrostatic force generated between the movable comb electrode and the fixed comb electrode. In order to increase drive force, a larger total area where the movable comb electrode and the fixed comb electrode face each other has been required for the MEMS mirror of this type. In order to increase the total area where the movable comb electrode and the fixed comb electrode face each other, the area of each of the movable comb electrode and the fixed comb electrode may be increased, or the number of the movable comb electrode and the fixed comb electrode may be increased, for example. However, there are various limitations on an increase in the size or number of the movable comb electrode and the fixed comb electrode, and therefore, the size or number of the movable comb electrode and the fixed comb electrode cannot be easily increased.

Some semiconductor devices are each configured such that a movable comb electrode and a fixed comb electrode are used as detection electrodes configured to detect the amount of movement of a moving member. Specifically, the amount of movement of the moving member is detected based on a change in the electrostatic capacitance between the movable comb electrode and the fixed comb electrode. In this case, in order to enhance the accuracy in detection of the amount of movement, the area of each of the movable comb electrode and the fixed comb electrode may be increased, or the number of the movable comb electrode and the fixed comb electrode may be increased, for example. However, there are, as described above, various limitations on an increase in the size or number of the movable comb electrode and the fixed comb electrode, and therefore, the size or number of the movable comb electrode and the fixed comb electrode cannot be easily increased.

SUMMARY

The technique disclosed herein has been made in view of the above-described points, and is intended to increase the total area where a movable comb electrode and a fixed comb electrode face each other.

A semiconductor device disclosed herein includes a base, a tilting portion configured to tilt about a tilting axis with respect to the base, a fixed comb electrode including a plurality of electrode fingers arranged in the arrangement direction along the tilting axis and provided at the base, and a movable comb electrode including a plurality of electrode fingers arranged in the arrangement direction and provided at the tilting portion, the electrodes fingers of the fixed comb electrode and the movable comb electrode being alternately arranged. The tilting portion includes a body and an extension extending from the body. Some of the electrode fingers of the movable comb electrode are provided at the body, and another electrode fingers of the movable comb electrode are provided at the extension.

BRIEF DESCRIPTION OF THE DRAWINGS

FIG. 5A illustrates the step of etching a portion of the $SiO_2$ film with a first resist mask. FIG. 5B illustrates the step of forming an Au/Ti/Pt film. FIG. 5C illustrates the step of removing the Au/Ti/Pt film from the $SiO_2$ film.

FIG. 6A illustrates the step of forming a second resist mask. FIG. 6B illustrates the step of etching a first silicon layer. FIG. 6C illustrates the step of etching an oxide layer from a first silicon layer side.

FIG. 10A illustrates the step of forming a fourth resist mask. FIG. 10B illustrates the step of etching the $SiO_2$ film.

FIG. 11A illustrates the step of placing a photomask. FIG. 11B illustrates the step of forming the fifth resist mask. FIG. 11C illustrates the step of forming an oxide mask.

FIG. 12A illustrates the step of etching the second silicon layer. FIG. 12B illustrates the step of etching the oxide layer.

FIG. 13A illustrates the step of detaching the fourth resist mask. FIG. 13B illustrates the step of etching an unnecessary portion of the first and second silicon layers.

FIG. 16A illustrates the state in which a photomask is displaced. FIG. 16B illustrates the state in which the fourth resist mask is displaced. FIG. 16C illustrates the state in which the final mask is displaced.

FIG. 17A illustrates the state in which the second silicon layer and the oxide layer are etched. FIG. 17B illustrates the state in which an unnecessary portion of the first and second silicon layers is etched.

DETAILED DESCRIPTION

An example embodiment will be described below in detail with reference to drawings.

Figure 1:
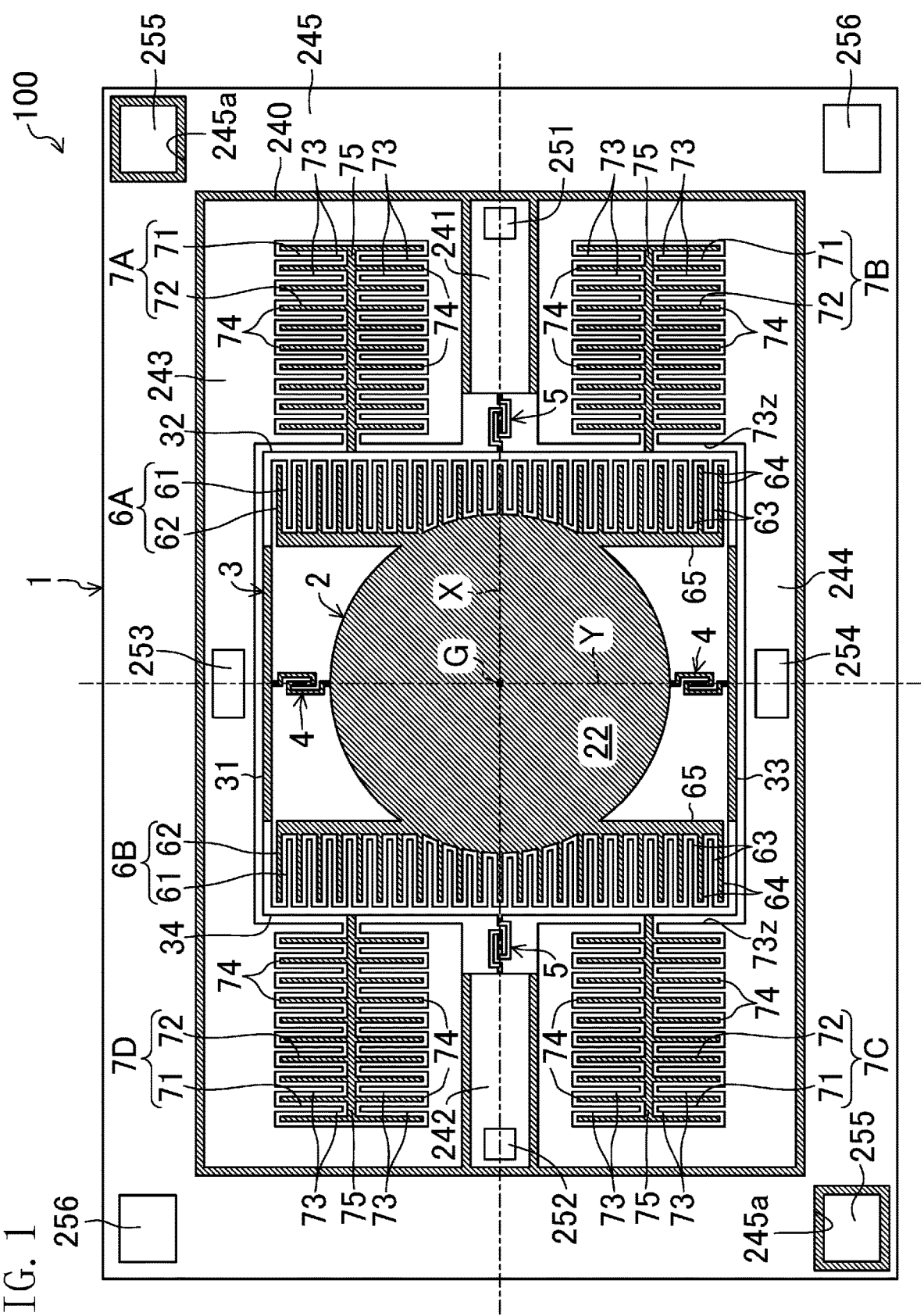
FIG. 1 is a plan view of a mirror device.
Figure 2:
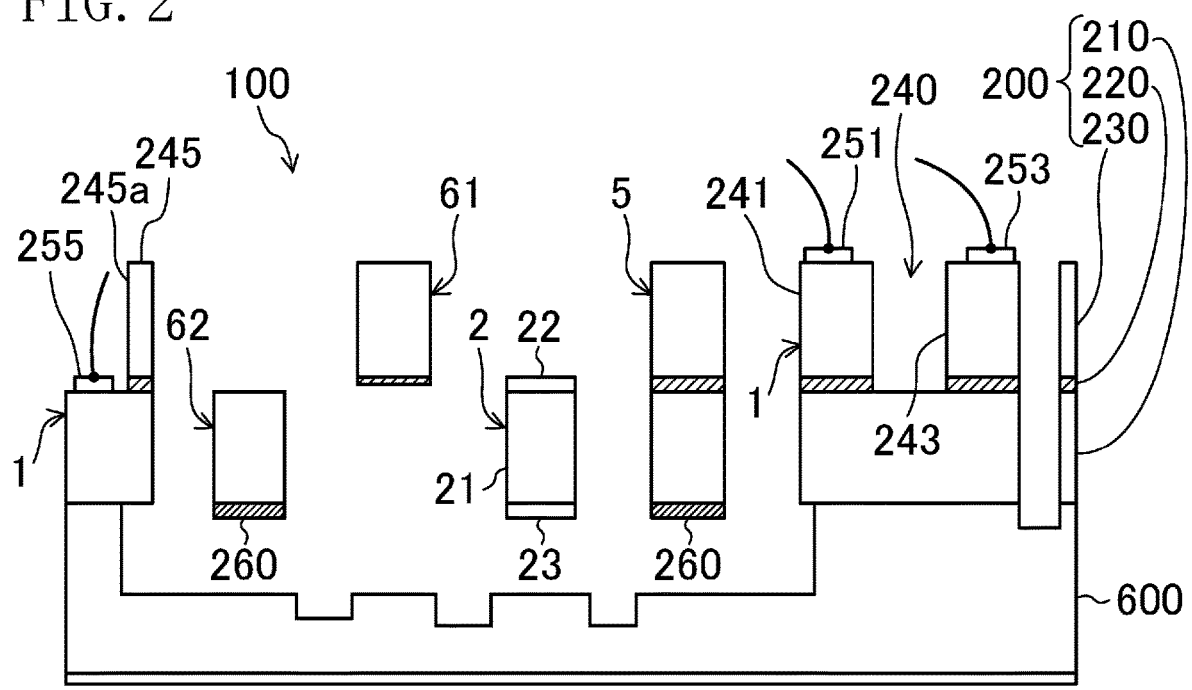
FIG. 2 is a schematic cross-sectional view of the mirror device.

FIG. 1 is a plan view of a mirror device 100, and FIG. 2 is a schematic cross-sectional view of the mirror device 100. Note that FIG. 2 schematically illustrates, as an cross-sectional view, some structures of the mirror device 100. For this reason, the shape and the positional relationship of the structures are not precisely illustrated in FIG. 2.

[Configuration of Mirror Device]

The mirror device 100 includes a frame-shaped base 1, a mirror 2, a frame body 3, first hinges 4 each connecting between the mirror 2 and the frame body 3, second hinges 5 each connecting between the frame body 3 and the base 1, first and second inner drive electrodes 6A, 6B each configured to drive the mirror 2 on the frame body 3, first to fourth outer drive electrodes 7A to 7D each configured to drive the frame body 3 on the base 1, and a controller (not shown) configured to control tilting of the mirror 2. The mirror device 100 is configured to tilt the mirror 2 about a main axis X and a sub-axis Y orthogonal to each other. The mirror device 100 is an example of an electronic component.

As illustrated in FIG. 2, the mirror device 100 is manufactured using a silicon-on-insulator (SOI) substrate 200. The SOI substrate 200 is configured such that a first silicon layer 210 made of silicon, an oxide layer 220 made of $SiO_2$, and a second silicon layer 230 made of silicon are stacked on each other in this order. Note that in FIG. 1, the portion formed of the second silicon layer 230 and being visible as viewed in the plane is hatched. Although a later-described mirrored surface layer 22 is provided on the mirror 2, such a portion is hatched in FIG. 1.

The base 1 is formed in a substantially rectangular frame shape. A substantially square opening is formed substantially at the center of the base 1. The axis extending parallel to the long side of the base 1 and passing the gravity center G of the mirror 2 is the X-axis, and the axis extending parallel to the short side of the base 1 and passing the gravity center G of the mirror 2 is the Y-axis. A major portion of the base 1 is formed of the first silicon layer 210, the oxide layer 220, and the second silicon layer 230.

The frame body 3 is formed in a substantially square frame shape. The frame body 3 is placed in the opening formed substantially at the center of the base 1. A substantially square opening is formed substantially at the center of the frame body 3. The frame body 3 includes first and third side portions 31, 33 extending parallel to the X-axis, and second and fourth side portions 32, 34 extending parallel to the Y-axis. Of each of the first side portion 31 and the third side portion 33, a portion (hereinafter referred to as an "intermediate portion") other than both end portions is formed of the first silicon layer 210. Both end portions of each of the first and third side portions 31, 33 are formed of the first silicon layer 210, the oxide layer 220, and the second silicon layer 230. Moreover, the second side portion 32 and the fourth side portion 34 are formed of the first silicon layer 210, the oxide layer 220, and the second silicon layer 230. The frame body 3 is an example of a base.

The mirror 2 is formed in a substantially circular plate shape. The mirror 2 tilts about the Y-axis with respect to the frame body 3. As illustrated in FIG. 2, the mirror 2 includes a mirror body 21, the mirrored surface layer 22 stacked on the front surface of the mirror body 21, a mirrored surface layer 23 stacked on the back surface of the mirror body 21, and an extension 65 extending from the mirror body 21 in parallel with the Y-axis. The mirror body 21 is formed of the first silicon layer 210. The mirrored surface layers 22, 23 are formed of Au/Ti/Pt films. The mirrored surface layer 23 has the function of balancing film stress caused at the surface of the mirror body 21 due to the mirrored surface layer 22. With this configuration, the flatness of the mirror body 21 and the flatness of the mirrored surface layer 22 can be improved. The mirror 2 is an example of a tilting portion, the Y-axis is an example of a tilting axis, and the mirror body 21 is an example of a body.

The first hinges 4 are provided to face each other with respect to the gravity center G of the mirror 2. Specifically, the first hinges 4 are arranged respectively at peripheral edge portions of the mirror 2 on the Y-axis. The mirror 2 is sandwiched between two first hinges 4. A first end of each first hinge 4 is connected to the mirror 2, and a second end of each first hinge 4 is connected to the frame body 3. One of the first hinges 4 is connected to the substantially middle of the first side portion 31 of the frame body 3 in the longitudinal direction of the first side portion 31. The other first hinge 4 is connected to the substantially middle of the third side portion 33 of the frame body 3 in the longitudinal direction of the third side portion 33. Each first hinge 4 extends to meander between the mirror 2 and a corresponding one of the first and third side portions 31, 33 of the frame body 3. With this configuration, each first hinge 4 is easily deformable. The first hinges 4 are formed of the first silicon layer 210. Each first hinge 4 is an example of a connection portion.

The second hinges 5 are provided to face each other with respect to the gravity center G of the mirror 2. Specifically, the second hinges 5 are arranged respectively at peripheral edge portions of the frame body 3 on the X-axis. That is, the first hinges 4 and the second hinges 5 are alternately arranged every 90 degrees about the gravity center G of the mirror 2. A first end of each second hinge 5 is connected to the frame body 3, and a second end of each second hinge 5 is connected to the base 1. One of the second hinges 5 is connected to the substantially middle of the second side portion 32 of the frame body 3 in the longitudinal direction of the second side portion 32. The other second hinge 5 is connected to the substantially middle of the fourth side portion 34 of the frame body 3 in the longitudinal direction of the fourth side portion 34. Each second hinge 5 extends to meander between the base 1 and a corresponding one of the second and fourth side portions 32, 34 of the frame body 3. With this configuration, each second hinge 5 is easily deformable. The second hinges 5 are formed of the first silicon layer 210, the oxide layer 220, and the second silicon layer 230.

The first and second inner drive electrodes 6A, 6B are provided respectively at two points inside the frame body 3. Specifically, the first inner drive electrode 6A is provided at the second side portion 32 of the frame body 3 and a portion of the mirror 2 facing the second side portion 32. The second inner drive electrode 6B is provided at the fourth side portion 34 of the frame body 3 and a portion of the mirror 2 facing the fourth side portion 34. When the inner drive electrodes 6A, 6B are not distinguished from each other, each of the inner drive electrodes 6A, 6B is hereinafter simply referred to as an "inner drive electrode 6." Since the first inner drive electrode 6A and the second inner drive electrode 6B have the same configuration, only the configuration of the first inner drive electrode 6A will be described below.

The first inner drive electrode 6A includes a fixed inner comb electrode 61 and a movable inner comb electrode 62. The fixed inner comb electrode 61 is provided at the second side portion 32 of the frame body 3. The movable inner comb electrode 62 is provided at a portion of the mirror 2 facing the second side portion 32.

The fixed inner comb electrode 61 includes a plurality of electrode fingers 63 extending from the second side portion 32 toward the mirror 2. The electrode fingers 63 extend parallel to the X-axis direction, and are arranged at predetermined intervals in the Y-axis direction. The electrode fingers 63 are formed of the second silicon layer 230. That is, the Y-axis direction is the arrangement direction of the electrode fingers 63.

The movable inner comb electrode 62 includes a plurality of electrode fingers 64 extending outward from the mirror 2. The electrode fingers 64 extend parallel to the X-axis direction, and are arranged at predetermined intervals in the Y-axis direction. That is, the Y-axis direction is the arrangement direction of the electrode fingers 64. Some of the electrode fingers 64 are provided at the mirror body 21, and another electrode fingers 64 are provided at the extension 65. Moreover, the electrode fingers 64 and the electrode fingers 63 are alternately arranged. As viewed in the plane, each electrode finger 64 is interposed between adjacent two of the electrode fingers 63. That is, each electrode finger 63 is interposed between adjacent two of the electrode fingers 64 as viewed in the plane. Note that the electrode fingers 64 are formed of the first silicon layer 210. Thus, when no voltage is applied to the first inner drive electrode 6A, the electrode fingers 63 and the electrode fingers 64 are displaced from each other in the thickness direction (the direction perpendicular to the X-axis and the Y-axis) of the mirror device 100, and do not face each other.

The outer peripheral edge of the mirror body 21 is in a circular shape, and a portion of the mirror body 21 provided with the electrode fingers 64 curves to be raised outward. The electrode fingers 64 provided at the mirror body 21 are shorter than those provided at the extension 65. The line connecting tip ends of the electrode fingers 64 is parallel with the Y-axis. That is, the distance between the tip end of the electrode finger 64 and the Y-axis is the same among the electrode fingers 64. Moreover, the electrode fingers 64 provided at the extension 65 are thicker than those provided at the mirror body 21. Specifically, a longer electrode finger 64 results in a greater width of the electrode finger 64 in the Y-axis direction. Note that the portion of the mirror body 21 provided with the electrode fingers 64 may bend to be raised outward.

The extension 65 extends to the vicinity of the first side portion 31 or the third side portion 33 of the frame body 3. The first hinges 4 are arranged respectively on both sides of the mirror body 21 in the Y-axis direction, and the first side portion 31 and the third side portion 33 are arranged outside the first hinges 4 in the Y-axis direction. That is, the space where each first hinge 4 is disposed is formed between the mirror body 21 and a corresponding one of the first side portion 31 or the third side portion 33. The extension 65 extends in the Y-axis direction in this space. That is, the electrode fingers 64 can be arranged, using the space formed between the mirror body 21 and each of the first side portion 31 and the third side portion 33 so that a corresponding one of the first hinges 4 can be disposed.

Of the electrode fingers 64 provided at the extension 65, the electrode finger 64 (hereinafter referred to as an "end electrode finger 64") provided on the outermost end side of the extension 65 is, as viewed in the plane, positioned between the frame body 3 (specifically, the first side portion 31 or the third side portion 33) and the electrode finger 63 provided on the outermost end side in the Y-axis direction. That is, the end electrode finger 64 faces the frame body 3. A portion of the frame body 3 facing the end electrode finger 64 is formed of the first silicon layer 210, the oxide layer 220, and the second silicon layer 230. A portion of the frame body 3 formed of the second silicon layer 230 is in electrical conduction with the electrode fingers 63. Thus, the portion of the frame body 3 facing the end electrode finger 64 functions as an electrode finger 63.

Since the electrode fingers 64 are formed of the first silicon layer 210, the electrode fingers 64 are in electrical conduction with the frame body 3 via the mirror 2 and the first hinges 4. Moreover, since the electrode fingers 63 are provided at the frame body 3, the electrode fingers 63 are also in electrical conduction with the frame body 3. However, portions (i.e., the intermediate portions of the first side portion 31 and the third side portion 33) of the frame body 3 connected respectively to the first hinges 4 are formed of the first silicon layer 210, and the electrode fingers 63 extend only from the second silicon layer 230 forming the second and fourth side portions 32, 34 of the frame body 3. That is, the electrode fingers 63 and the electrode fingers 64 are insulated from each other via the oxide layer 220 of the frame body 3.

The first to fourth outer drive electrodes 7A to 7D are provided respectively at four points outside the frame body 3. Specifically, the first and second outer drive electrodes 7A, 7B are provided respectively at both end portions of the second side portion 32 of the frame body 3. The third and fourth outer drive electrodes 7C, 7D are provided respectively at both end portions of the fourth side portion 34 of the frame body 3. When the outer drive electrodes 7A to 7D are not distinguished from each other, each of the outer drive electrodes 7A to 7D is hereinafter simply referred to as an "outer drive electrode 7." Since the first to fourth outer drive electrodes 7A to 7D have the same configuration, only the configuration of the first outer drive electrode 7A will be described below.

The first outer drive electrode 7A includes a fixed outer comb electrode 71 and a movable outer comb electrode 72. The fixed outer comb electrode 71 is provided at a recess formed at the position of the base 1 facing the end portion of the second side portion 32. The movable outer comb electrode 72 is provided at the second side portion 32 of the frame body 3.

The fixed outer comb electrode 71 includes a plurality of electrode fingers 73. The recess of the base 1 is formed in a rectangular shape. The electrode fingers 73 extend inward from two sides, extending parallel to the X-axis, of the recess in parallel with the Y-axis. The electrode fingers 73 provided on each side are arranged at predetermined intervals in the X-axis direction. The electrode fingers 73 are formed of the second silicon layer 230. Of the electrode fingers 73, the electrode finger 73 (hereinafter referred to as an "end electrode finger 73z") closest to the frame body 3 is formed thicker than the width (the dimension in the X-axis direction) of other electrode fingers 73. With this configuration, bending of the end electrode finger 73z is reduced. That is, each of the electrode fingers 73 other than the end electrode finger 73z is placed between adjacent two of electrode fingers 74 as viewed in the plane. On the other hand, the end electrode finger 73z is adjacent to the single electrode finger 74 as viewed in the plane, and is not sandwiched between adjacent two of the electrode fingers 74. Thus, when electrostatic attractive force is generated between the electrode finger 73 and the electrode finger 74 (the details will be described later), electrostatic attractive force is generated on both sides of each of the electrode fingers 73 other than the end electrode finger 73z, and is generated only on one side of the end electrode finger 73z facing the electrode finger 74. That is, each of the electrode fingers 73 other than the end electrode finger 73z is pulled by adjacent two of the electrode fingers 74, and therefore, does not bend toward either one of the electrode fingers 74. The end electrode finger 73z is pulled toward one side facing the electrode finger 74. For this reason, the end electrode finger 73z is formed thicker than the other electrode fingers 73, and therefore, bending of the end electrode finger 73z is reduced.

The movable outer comb electrode 72 includes the electrode fingers 74. An extension 75 extending outward of the frame body 3 in parallel with the X-axis is provided at the second side portion 32 of the frame body 3. The electrode fingers 74 extend from the extension 75 toward both sides of the extension 75 in parallel with the Y-axis, and are arranged at predetermined intervals in the X-axis direction. As viewed in the plane, each electrode finger 74 is interposed between adjacent two of the electrode fingers 73. That is, each electrode finger 73 is interposed between adjacent two of the electrode fingers 74 as viewed in the plane. Note that the electrode fingers 74 are formed of the first silicon layer 210. Thus, when no voltage is applied to the first outer drive electrode 7A, the electrode fingers 73 and the electrode fingers 74 are displaced from each other in the thickness direction of the mirror device 100, and do not face each other.

The electrode fingers 73 are formed of the second silicon layer 230 of the base 1, and the electrode fingers 74 are formed of the first silicon layer 210 of the frame body 3. Thus, the electrode fingers 73 and the electrode fingers 74 are insulated from each other via the oxide layer 220.

The fixed inner comb electrode 61 and the movable outer comb electrode 72 are provided at each of the second and fourth side portions 32, 34 of the frame body 3. However, the fixed inner comb electrode 61 is formed of the second silicon layer 230, and the movable outer comb electrode 72 is formed of the first silicon layer 210. For this reason, the fixed inner comb electrode 61 and the movable outer comb electrode 72 are insulated from each other via the oxide layer 220 of the frame body 3.

The line connecting tip ends of the electrode fingers 74 extending from the extension 75 toward the same side is parallel with the X-axis. The distance between the X-axis and the tip end of each electrode finger 74 extending from the extension 75 toward the side opposite to the X-axis is substantially equal to the distance between the Y-axis and the tip end of each electrode finger 64 of the movable inner comb electrode 62. Thus, the tilting extent about the X-axis and the tilting extent about the Y-axis in tilting of the mirror 2 (details will be described later) can be substantially equal to each other.

A portion of the base 1 formed of the second silicon layer 230 is, by an insulation groove 240, divided into several regions electrically insulated from each other. Specifically, the portion of the base 1 formed of the second silicon layer 230 includes the following regions: a first region 241 which is in electrical conduction with the fixed inner comb electrode 61 of the first inner drive electrode 6A via one of the second hinges 5; a second region 242 which is in electrical conduction with the fixed inner comb electrode 61 of the second inner drive electrode 6B via the other second hinge 5; a third region 243 which is in electrical conduction with the fixed outer comb electrode 71 of the first outer drive electrode 7A and the fixed outer comb electrode 71 of the fourth outer drive electrode 7D; a fourth region 244 which is in electrical conduction with the fixed outer comb electrode 71 of the second outer drive electrode 7B and the fixed outer comb electrode 71 of the third outer drive electrode 7C; and a frame-shaped fifth region 245 positioned on the outermost side.

A first drive electrode 251 is provided in the first region 241. The first drive electrode 251 is in electrical conduction with the fixed inner comb electrode 61 of the first inner drive electrode 6A via the second hinge 5. Moreover, a second drive electrode 252 is provided in the second region 242. The second drive electrode 252 is in electrical conduction with the fixed inner comb electrode 61 of the second inner drive electrode 6B via the second hinge 5.

A third drive electrode 253 is provided in the third region 243. The third drive electrode 253 is in electrical conduction with the fixed outer comb electrode 71 of the first outer drive electrode 7A and the fixed outer comb electrode 71 of the fourth outer drive electrode 7D. Moreover, a fourth drive electrode 254 is provided in the fourth region 244. The fourth drive electrode 254 is in electrical conduction with the fixed outer comb electrode 71 of the second outer drive electrode 7B and the fixed outer comb electrode 71 of the third outer drive electrode 7C.

Openings 245a are formed respectively at two of four corners of the fifth region 245, the two corners being on a diagonal line. Each opening 245a penetrates the second silicon layer 230 and the oxide layer 220. A common electrode 255 is provided on the first silicon layer 210 exposed through each opening 245a. Moreover, dummy electrodes 256 are provided respectively at the remaining two corners of the fifth region 245, the remaining two corners being formed without the openings 245a. Each dummy electrode 256 is provided on the second silicon layer 230.

Note that the insulation groove 240 does not penetrate through the outer peripheral edge of the base 1. That is, the insulation groove 240 does not open at the outer peripheral edge of the base 1. In manufacturing of the mirror device 100, a plurality of mirror devices 100 are formed from a single substrate, and finally, are separately into each device by dicing. The above-described configuration in which the insulation groove 240 does not open at the outer peripheral edge of the base 1 can prevent water from entering the insulation groove 240 in dicing.

[Operation of Mirror Device]

Operation of the mirror device 100 configured as described above will be described.

The controller is configured to apply drive voltage to the first to fourth drive electrodes 251 to 254 to tilt the mirror 2. The controller applies the drive voltage to the first drive electrode 251 or the second drive electrode 252 to tilt the mirror 2 about the Y-axis. On the other hand, the controller applies the drive voltage to the third drive electrode 253 or the fourth drive electrode 254 to tilt the mirror 2 about the X-axis.

Specifically, before application of the drive voltage, the fixed inner comb electrode 61 and the movable inner comb electrode 62 in the inner drive electrode 6 are displaced from each other in the thickness direction of the mirror device 100, and the fixed outer comb electrode 71 and the movable outer comb electrode 72 in the outer drive electrode 7 are displaced from each other in the thickness direction of the mirror device 100. When the drive voltage is applied to the first drive electrode 251 in this state, electrostatic attractive force is generated between the fixed inner comb electrode 61 and the movable inner comb electrode 62 in the first inner drive electrode 6A. With such electrostatic attractive force, the fixed inner comb electrode 61 attracts the movable inner comb electrode 62. As a result, the mirror 2 tilts about the Y-axis such that the movable inner comb electrode 62 of the first inner drive electrode 6A is lifted up. On the other hand, when the drive voltage is applied to the second drive electrode 252, electrostatic attractive force is generated between the fixed inner comb electrode 61 and the movable inner comb electrode 62 in the second inner drive electrode 6B. With such electrostatic attractive force, the fixed inner comb electrode 61 attracts the movable inner comb electrode 62. As a result, the mirror 2 tilts about the Y-axis such that the movable inner comb electrode 62 of the second inner drive electrode 6B is lifted up. Moreover, when the drive voltage is applied to the third drive electrode 253, electrostatic attractive force is generated between the fixed outer comb electrode 71 and the movable outer comb electrode 72 in the first outer drive electrode 7A and between the fixed outer comb electrode 71 and the movable outer comb electrode 72 in the fourth outer drive electrode 7D. With such electrostatic attractive force, the fixed outer comb electrode 71 attracts the movable outer comb electrode 72. As a result, the mirror 2 tilts about the X-axis such that the movable outer comb electrode 72 of the first outer drive electrode 7A and the movable outer comb electrode 72 of the fourth outer drive electrode 7D are lifted up. On the other hand, when the drive voltage is applied to the fourth drive electrode 254, electrostatic attractive force is generated between the fixed outer comb electrode 71 and the movable outer comb electrode 72 in the second outer drive electrode 7B and between the fixed outer comb electrode 71 and the movable outer comb electrode 72 in the third outer drive electrode 7C. With such electrostatic attractive force, the fixed outer comb electrode 71 attracts the movable outer comb electrode 72. As a result, the mirror 2 tilts about the X-axis such that the movable outer comb electrode 72 of the second outer drive electrode 7B and the movable outer comb electrode 72 of the third outer drive electrode 7C are lifted up.

The amount of tilting of the mirror 2 can be detected in such a manner that the mirror 2 is irradiated with light, and then, the reflected light from the mirror 2 is detected by, e.g., a photo detector. The controller feeds back the tilting amount of the mirror 2 detected as described above to adjust the drive voltage to be applied to the first to fourth drive electrodes 251 to 254. In this manner, tilting of the mirror 2 is controlled.

[Method for Manufacturing Mirror Device]

The method for manufacturing the mirror device 100 will be described.

The mirror device 100 includes a first structure formed of the first silicon layer 210 and the second silicon layer 230, a second structure not including the first silicon layer 210 and formed of the second silicon layer 230, and a third structure not including the second silicon layer 230 and formed of the first silicon layer 210. Note that the structures are categorized according to the first silicon layer 210 and the second silicon layer 230, and therefore, each structure may or may not include the oxide layer 220. For example, the first structure of the present embodiment includes the oxide layer 220. In the present embodiment, the base 1, a portion (both end portions of the first side portion 31, both end portions of the third side portion 33, the second side portion 32, and the fourth side portion 34) of the frame body 3, and the second hinges 5 are the first structures. The fixed inner comb electrode 61 and the fixed outer comb electrode 71 are the second structures. The mirror 2, a portion (the intermediate portion of the first side portion 31 and the intermediate portion of the third side portion 33) of the frame body 3, the first hinges 4, the movable inner comb electrode 62, and the movable outer comb electrode 72 are the third structures.

Note that FIG. 2 illustrates the base 1 and the second hinge 5 as examples of the first structure, illustrates the fixed inner comb electrode 61 as an example of the second structure, and illustrates the mirror 2 and the movable inner comb electrode 62 as examples of the third structure. Although each structure illustrated in FIG. 2 will be described below, the structure not illustrated as an example is also formed as in the structure of the same category.

Figure 3:
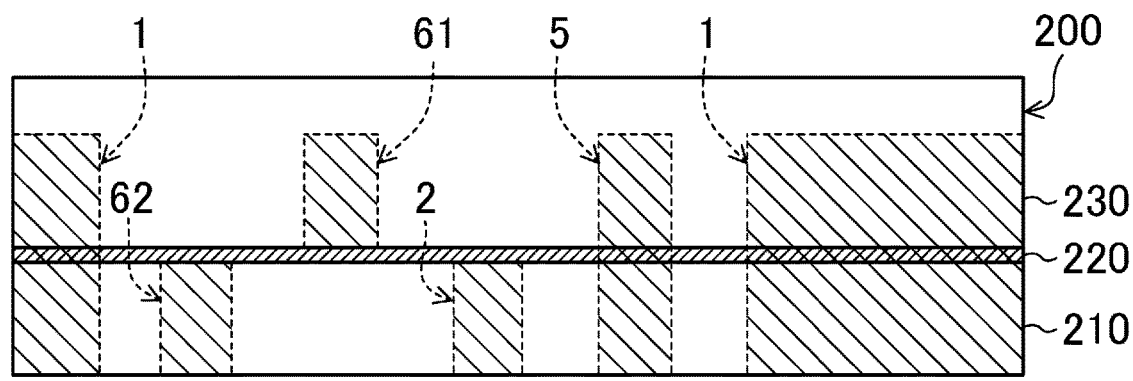
FIG. 3 is a cross-sectional view of an SOI substrate.

First, as illustrated in FIG. 3, an SOI substrate 200 is prepared. FIG. 3 is a cross-sectional view of the SOI substrate 200. In FIG. 3, each structure, which will be formed in the SOI substrate 200, of the mirror device 100 is indicated by dashed lines, and is hatched. As described above, the SOI substrate 200 is configured such that a first silicon layer 210 made of silicon, an oxide layer 220 made of $SiO_2$, and a second silicon layer 230 made of silicon are stacked on each other in this order. The SOI substrate 200 is an example of a substrate. The first silicon layer 210 is an example of a first layer, the second silicon layer 230 is an example of a second layer, and the oxide layer 220 is an example of a third layer.

Next, the SOI substrate 200 is etched from the side close to the first silicon layer 210 (a first etching step). At this step, a portion of the first silicon layer 210 facing at least a fixed inner comb electrode 61 is removed by etching. In addition, a portion of the first silicon layer 210 is etched, except for a portion of the first silicon layer 210 forming a base 1, a mirror 2, second hinges 5, and a movable inner comb electrode 62.

Figure 4:
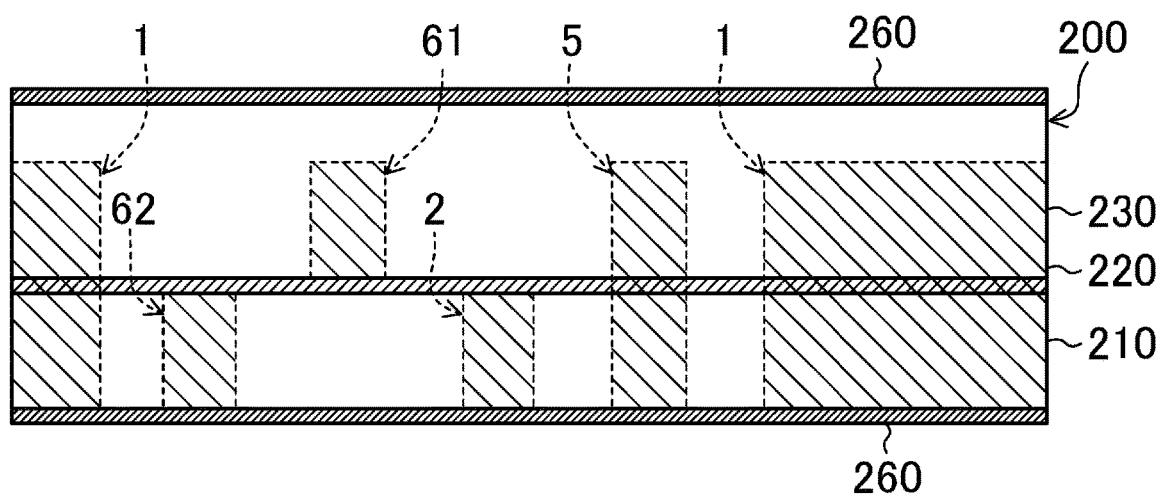
FIG. 4 is a view of the step of forming an $SiO_2$ film on the SOI substrate.

Specifically, $SiO_2$ films 260 are first formed respectively on both sides of the SOI substrate 200 by thermal oxidation, as illustrated in FIG. 4.

Next, a mirrored surface layer 23 is formed on the back surface of a mirror body 21.

Figure 5A:
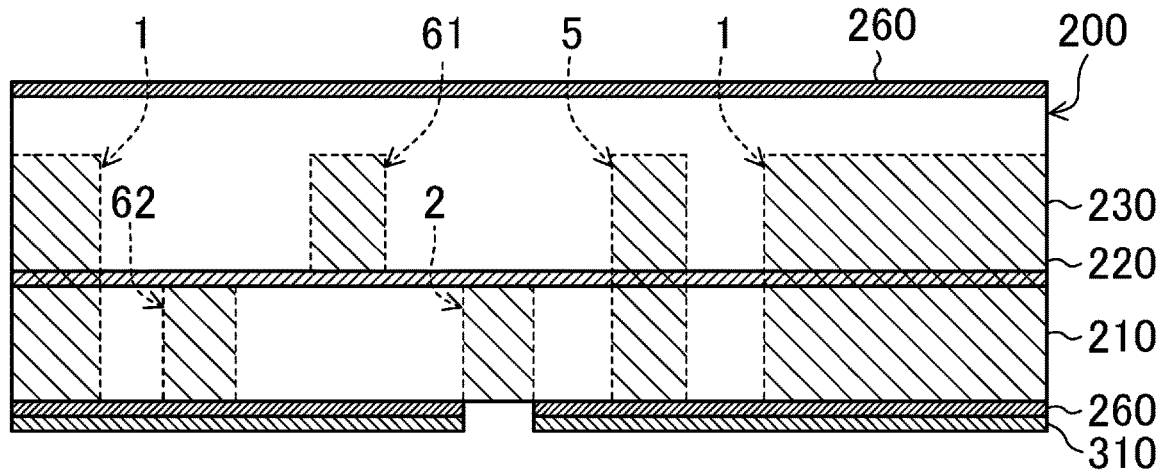
FIGS. 5A to 5C are views of the steps of forming a mirrored surface layer at a mirror pre-structure.

First, as illustrated in FIG. 5A, a first resist mask 310 is formed on the $SiO_2$ film 260 formed on the first silicon layer 210 of the SOI substrate 200, and then, a portion of the $SiO_2$ film 260 is etched. The $SiO_2$ film 260 on a portion of the first silicon layer 210 forming the mirror 2 is exposed through the first resist mask 310. The $SiO_2$ film 260 is etched using the first resist mask 310, and then, the $SiO_2$ film 260 at the portion of the first silicon layer 210 forming the mirror 2 is removed.

Figure 5B:
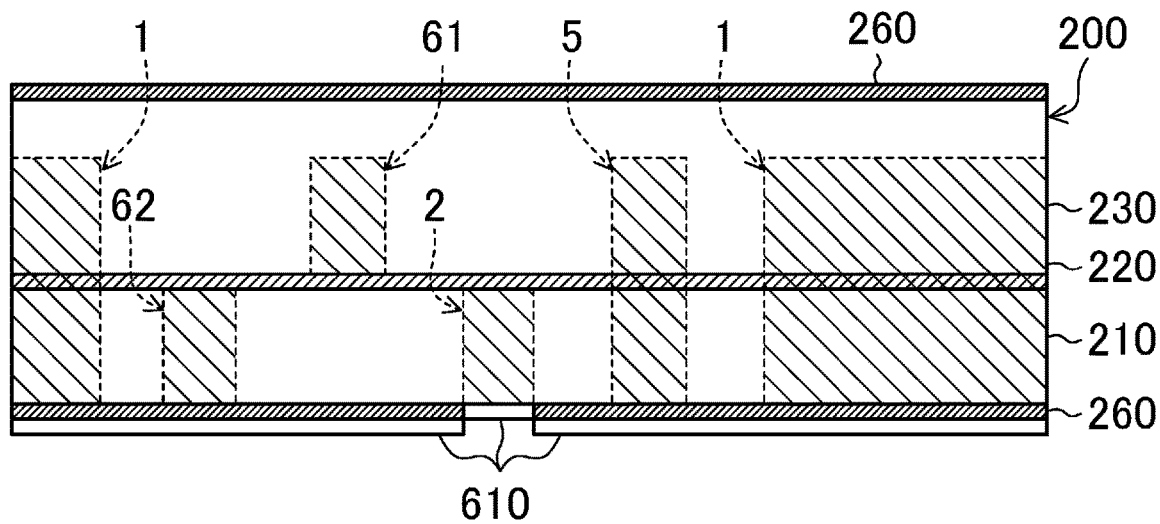

Subsequently, the first resist mask 310 is detached. As illustrated in FIG. 5B, an Au/Ti/Pt film 610 is, by sputtering, formed on the portion of the first silicon layer 210 forming the mirror 2. At this point, the Au/Ti/Pt film 610 is also formed on the $SiO_2$ film 260.

Figure 5C:
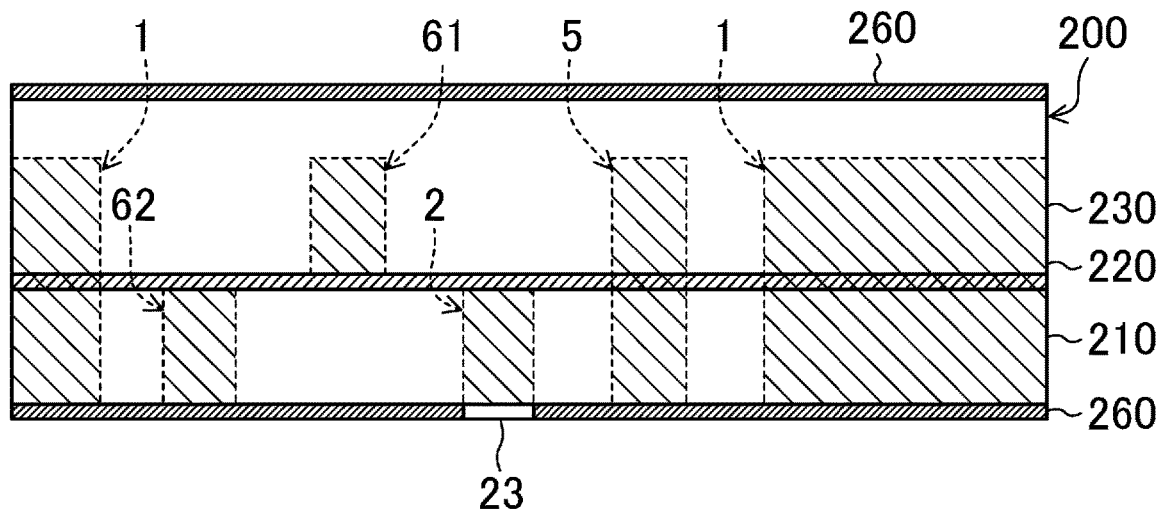

Then, a resist mask (not shown) is formed on the Au/Ti/Pt film 610 at the portion of the first silicon layer 210 forming the mirror 2, and then, the Au/Ti/Pt film 610 on the $SiO_2$ film 260 is removed by etching. In this manner, the mirrored surface layer 23 is formed of the Au/Ti/Pt film 610, as illustrated in FIG. 5C. Note that the $SiO_2$ film 260 remains on a portion of the first silicon layer 210 other than the portion forming the mirror 2.

Subsequently, although not shown in the figure, the $SiO_2$ film 260 on a portion of the first silicon layer 210 is removed by etching, the portion of the first silicon layer 210 being joined to a later-described glass substrate 600.

Figure 6A:
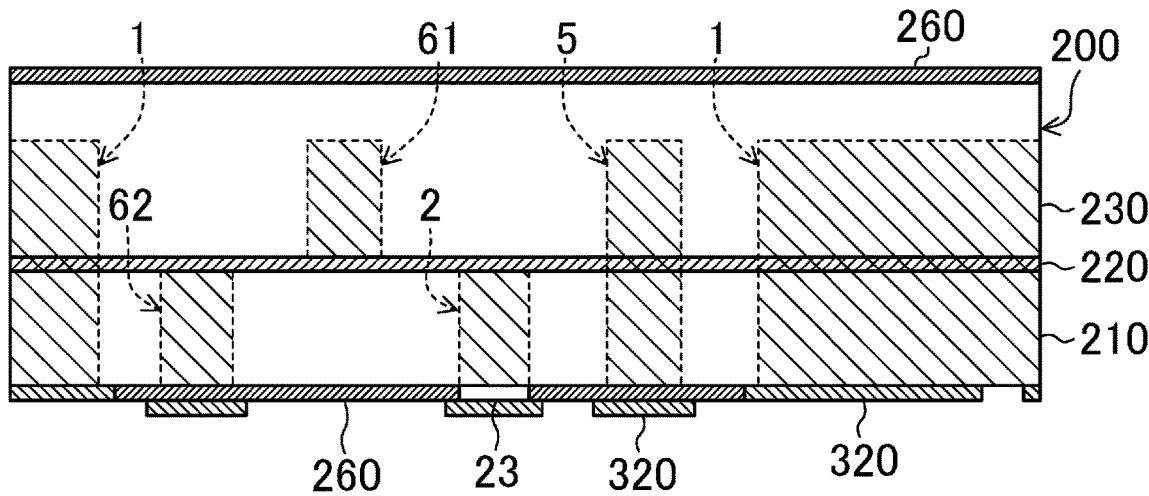
FIGS. 6A to 6C are views of a first etching step.

Next, a second resist mask 320 is formed on the first silicon layer 210. The second resist mask 320 is in the shape covering a portion of the first silicon layer 210 forming the first and third structures. In an example of FIG. 6A, a portion of the first silicon layer 210 forming the base 1, a portion of the first silicon layer 210 forming the mirror 2, a portion of the first silicon layer 210 forming the second hinges 5, and a portion of the first silicon layer 210 forming the movable inner comb electrode 62 are covered by the second resist mask 320. The second resist mask 320 has a larger shape than the final shape of a corresponding one of the structures. Unless otherwise provided, the "final shape" and the "shape" mean the shape when the structure is viewed in the thickness direction of the mirror device 100, i.e., the shape when the structure is projected in the thickness direction of the mirror device 100.

Subsequently, the oxide layer 260 is etched using the second resist mask 320, and then, a portion of the oxide film 260 exposed through the second resist mask 320 is removed. Etching of the oxide layer 260 is etching (hereinafter referred to as "APS etching") using an advanced physical source (APS) of high-density plasma.

Figure 6B:
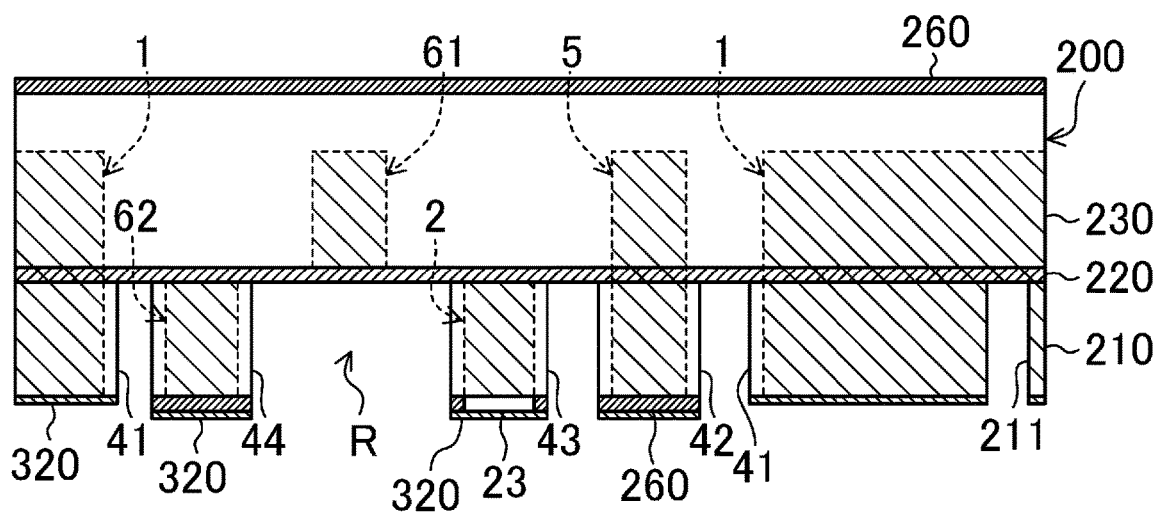

Next, as illustrated in FIG. 6B, the first silicon layer 210 is etched using the second resist mask 320. Etching of the silicon layer is etching (hereinafter referred to as "ICP etching") using inductively coupled plasma (ICP). In the first silicon layer 210, a pre-structure 41 formed of the first silicon layer 210 of the base 1, a pre-structure 42 formed of the first silicon layer 210 of each second hinge 5, a pre-structure 43 of the mirror 2, and a pre-structure 44 of the movable inner comb electrode 62 are formed. The "pre-structure" is the structure having a larger shape than a corresponding final shape and formed into the corresponding final shape by etching. Moreover, a portion of the first silicon layer 210 facing the fixed inner comb electrode 61 is etched such that a recess R is formed. Further, a first alignment mark 211 is formed in the first silicon layer 210.

The pre-structure 41 is hereinafter referred to as a "base pre-structure 41," the pre-structure 42 is hereinafter referred to as a "second-hinge pre-structure 42," the pre-structure 43 is hereinafter referred to as a "mirror pre-structure 43," and the pre-structure 44 is hereinafter referred to as a "movable-comb pre-structure 44." When the above-described pre-structures are not distinguished from each other, each pre-structure may be simply referred to as a "pre-structure." The base pre-structure 41 and the second-hinge pre-structure 42 are examples of a first pre-structure. The mirror pre-structure 43 and the movable-comb pre-structure 44 are examples of a third pre-structure.

Figure 6C:
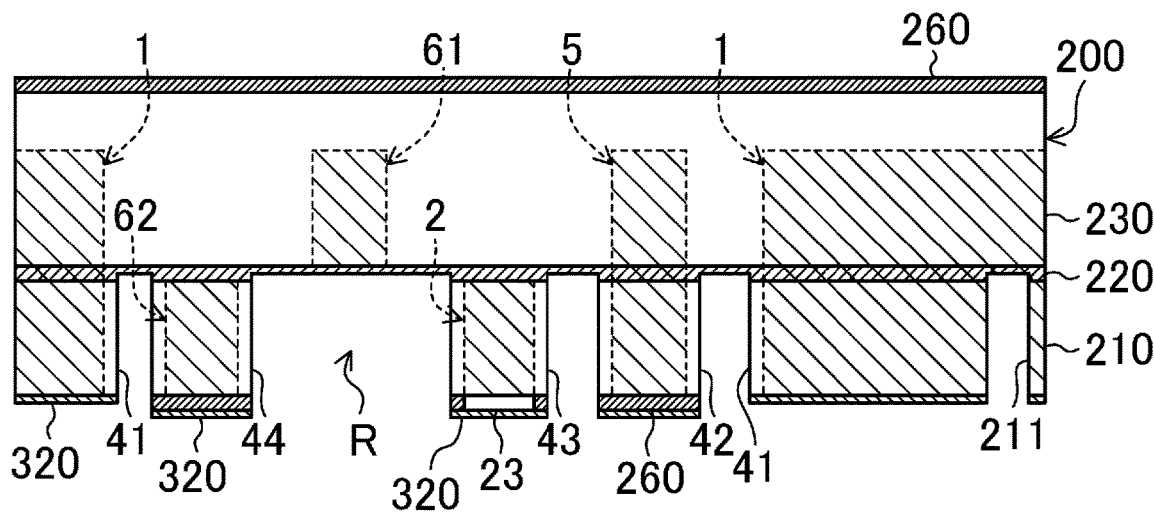

Subsequently, as illustrated in FIG. 6C, the oxide layer 220 is APS-etched using the second resist mask 320 such that a portion of the oxide layer 220 exposed through the second resist mask 320 becomes thinner. At this point, the oxide layer 220 is not completely etched, but the oxide layer 220 remains thin. After etching of the oxide layer 220, the second resist mask 320 is detached.

Figure 7:
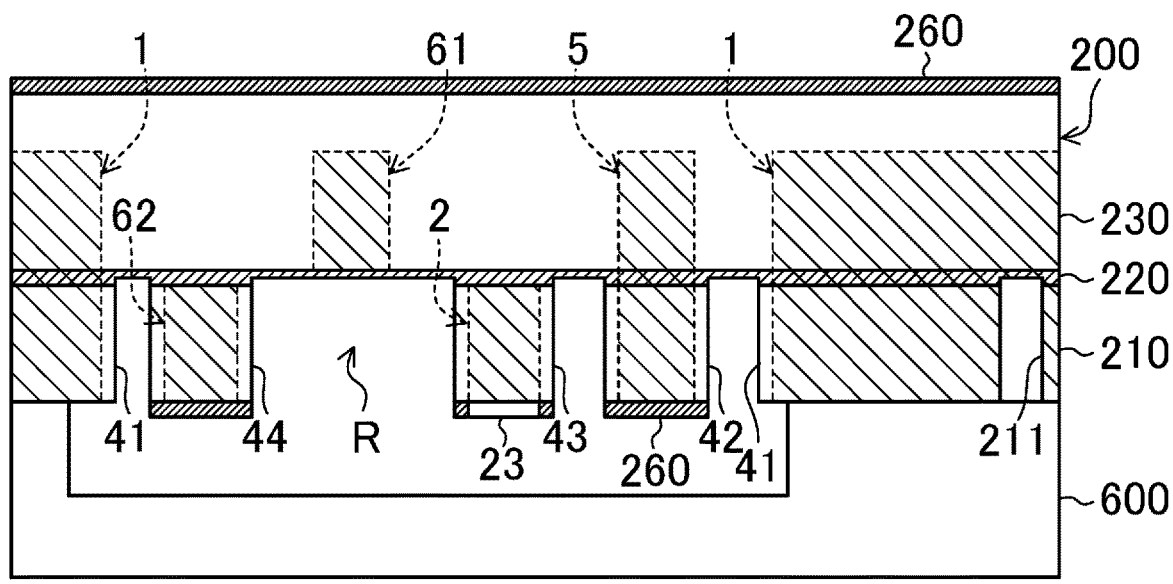
FIG. 7 is a view of the step of joining a glass substrate onto the SOI substrate.

Next, as illustrated in FIG. 7, an anode of the glass substrate 600 is welded to the first silicon layer 210. The glass substrate 600 is joined to a portion of the first silicon layer 210 not including the SiO$_2$ film 260.

Figure 8:
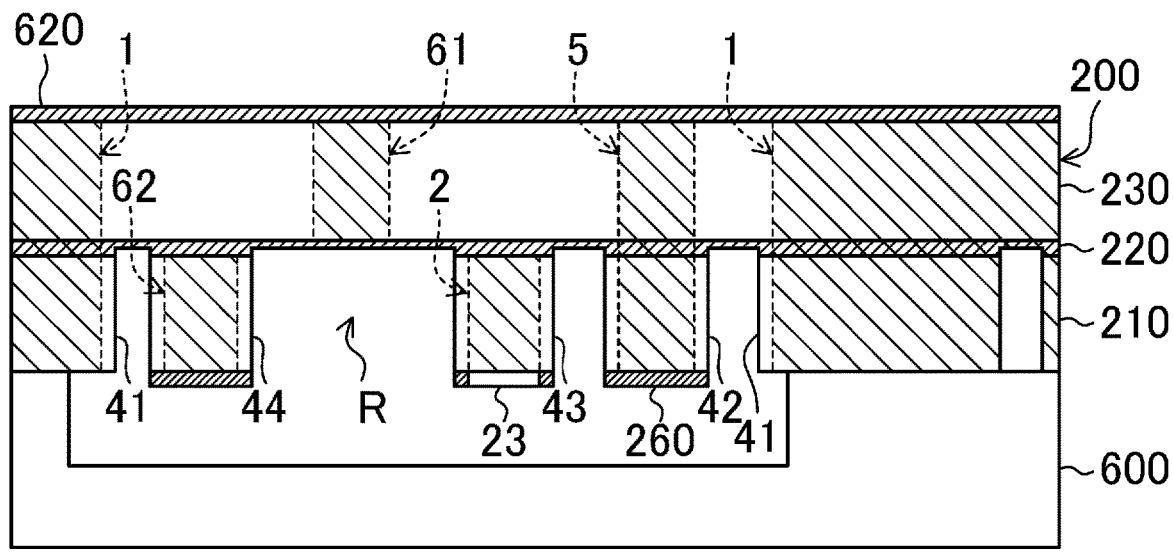
FIG. 8 is a view of the step of forming an $SiO_2$ film on a second silicon layer.

Next, a final mask 390 for etching the SOI substrate 200 from the side close to the second silicon layer 230 is formed (a mask formation step). The final mask 390 is an example of a mask. First, a SiO$_2$ film 620 is formed on the second silicon layer 230, as illustrated in FIG. 8. Specifically, the second silicon layer 230 is first processed thin to a desired thickness by back grinding. Subsequently, the SiO$_2$ film 620 is formed on the second silicon layer 230 by vapor deposition (e.g., low pressure CVD).

Figure 9:
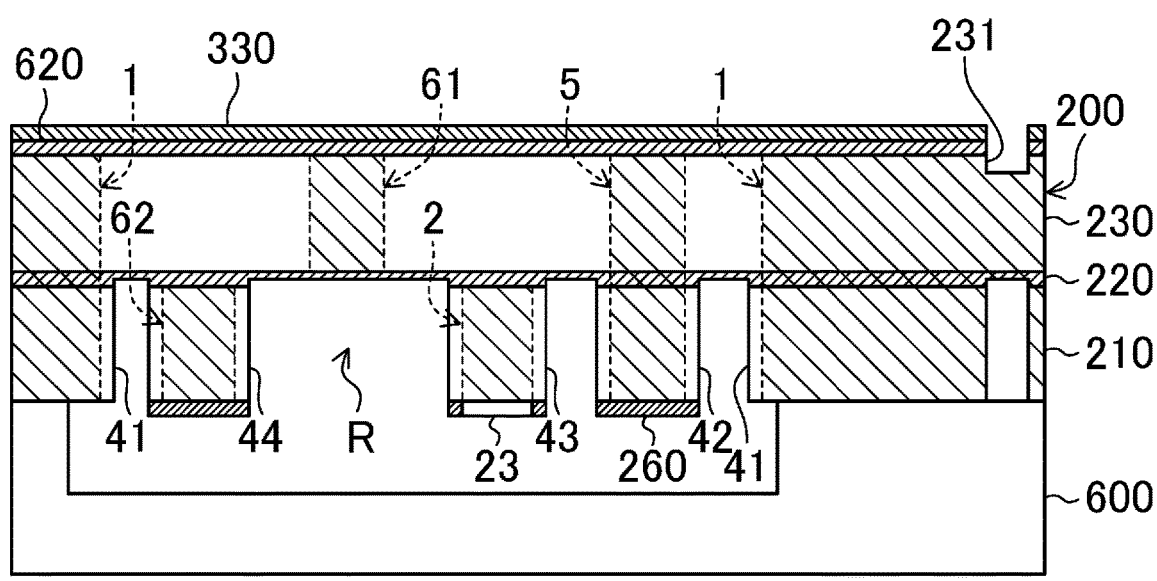
FIG. 9 is a view of the step of forming a second alignment mark on the second silicon layer.

Subsequently, a second alignment mark 231 is formed in the SiO$_2$ film 620 and the second silicon layer 230, as illustrated in FIG. 9. Specifically, a third resist mask 330 is formed on the SiO$_2$ film 620. The SiO$_2$ film 620 and the second silicon layer 230 are sequentially etched using the third resist mask 330, and as a result, the second alignment mark 231 is formed in the SiO$_2$ film 620 and the second silicon layer 230. Subsequently, the third resist mask 330 is detached.

Next, an oxide mask 370 is formed by etching of the SiO$_2$ film 620, and then, a fifth resist mask 350 is formed.

Figure 10A:
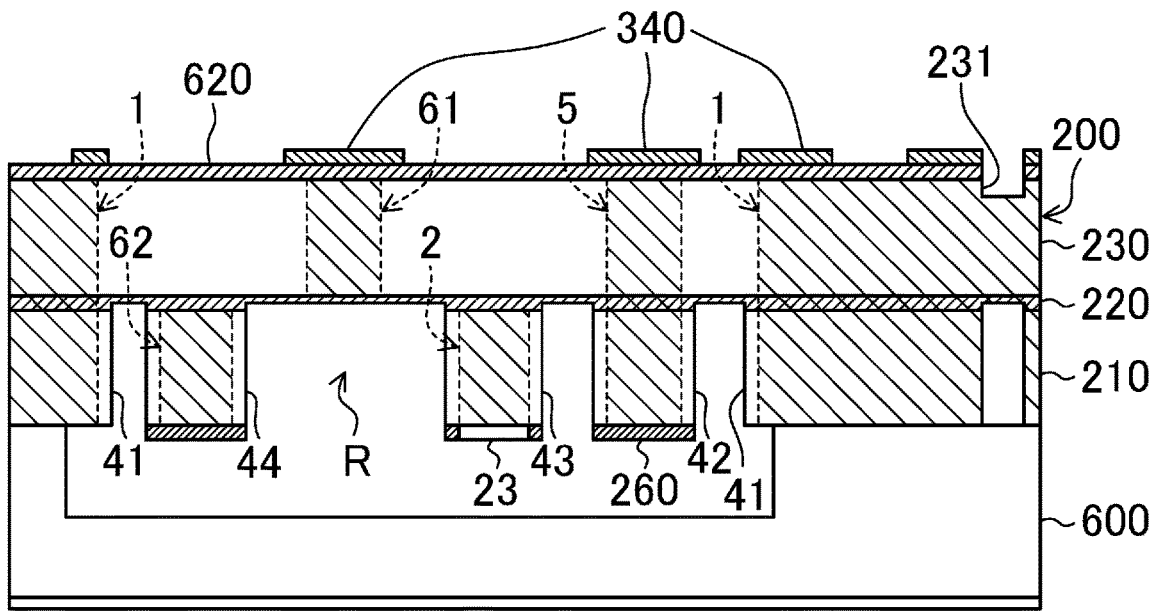
FIGS. 10A and 10B are views of the steps of forming an oxide mask.

As illustrated in FIG. 10A, a fourth resist mask 340 is first formed on the SiO$_2$ film 620. Although will be described in detail with reference to the fifth resist mask 350, the fourth resist mask 340 is formed as follows. After a resist is applied onto the SiO$_2$ film 620, a predetermined photomask (e.g., a stencil mask) is placed using the second alignment mark 231. Then, the resist is exposed with light, and is developed. In this manner, the fourth resist mask 340 is formed. The photomask is a shield member formed with an opening, and is a member which can be physically separated from the SOI substrate 200. The positional relationship of the resist mask is defined by the photomask.

Figure 10B:
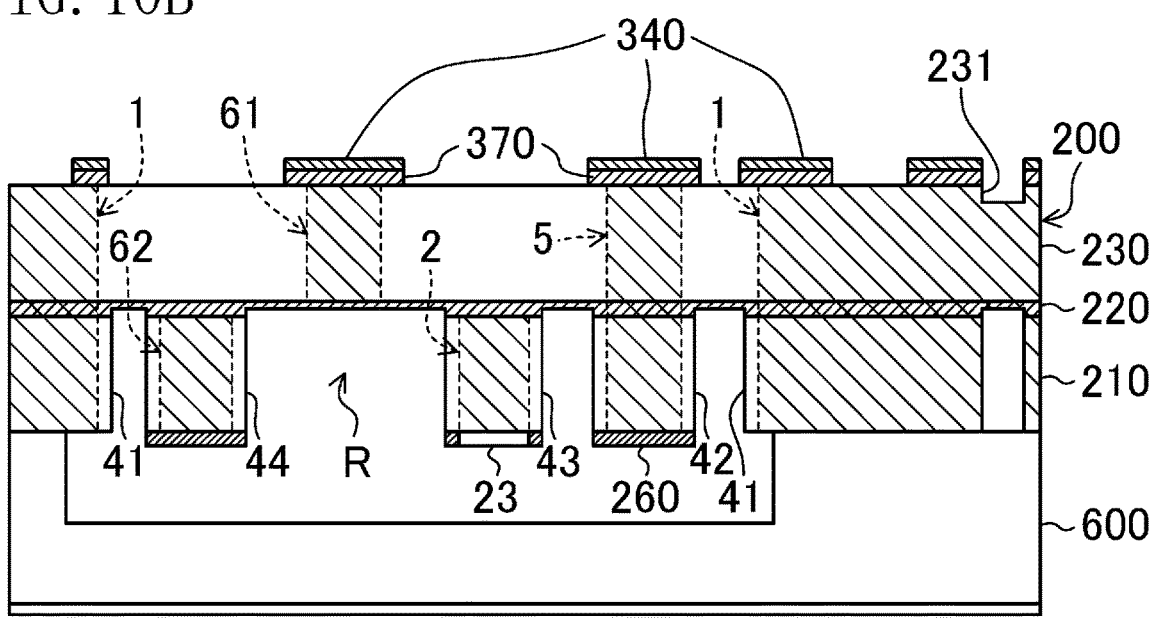

Subsequently, the SiO$_2$ film 620 is APS-etched using the fourth resist mask 340. In this manner, the oxide mask 370 is formed as illustrated in FIG. 10B. Then, the fourth resist mask 340 is detached.

The oxide mask 370 is in such a shape that a portion of the second silicon layer 230 forming the first and second structures is covered. In the example of FIG. 10B, a portion of the second silicon layer 230 forming the base 1, a portion of the second silicon layer 230 forming each second hinge 5, and a portion of the second silicon layer 230 forming the fixed inner comb electrode 61 are covered by the oxide mask 370. The oxide mask 370 has a larger shape than the final shape of a corresponding one of the structures.

Note that no oxide mask 370 is provided corresponding to an insulation groove 240 of the base 1 and to each opening 245a where a common electrode 255 is provided.

Figure 11A:
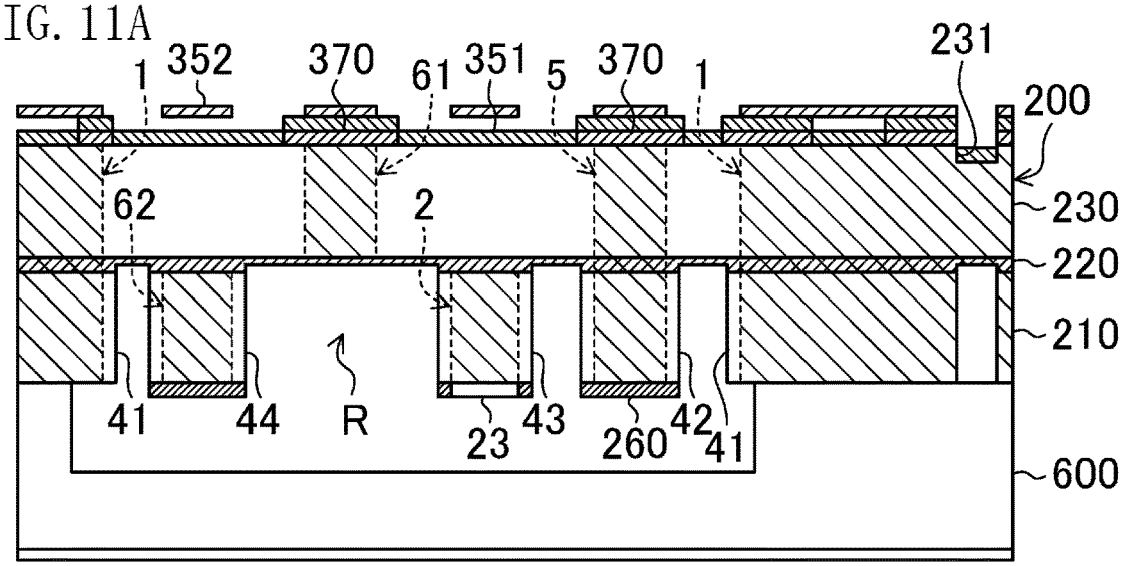
FIGS. 11A to 11C are views of the steps of forming a fifth resist mask.
Figure 11B:
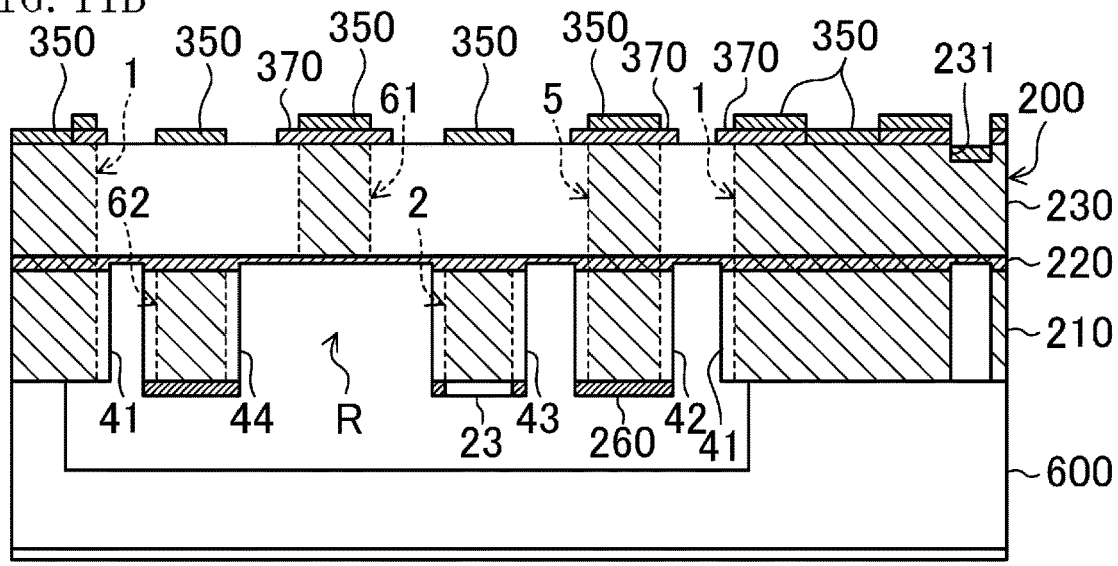

Subsequently, the fifth resist mask 350 is formed on the second silicon layer 230 and the oxide mask 370. First, a resist 351 is applied onto the second silicon layer 230 and the oxide mask 370. Subsequently, a photomask 352 is placed on the resist 351, as illustrated in FIG. 11A. Using the photomask 352, the resist 351 is exposed with light, and then, is developed. In this manner, the fifth resist mask 350 is formed as illustrated in FIG. 11B.

The fifth resist mask 350 is provided corresponding to the first to third structures. That is, the portion forming the first structure and the portion forming the second structure are doubly covered by the oxide mask 370 and the fifth resist mask 350. In the example of FIG. 11B, the oxide mask 370 and the fifth resist mask 350 are provided corresponding to the base 1, each second hinge 5, and the fixed inner comb electrode 61 on the second silicon layer 230. Only the fifth resist mask 350 is provided corresponding to the mirror 2 and the movable inner comb electrode 62 on the second silicon layer 230. In this state, the fifth resist mask 350 has the same shape as the final shape of a corresponding one of the structures. Thus, the oxide mask 370 protrudes beyond the fifth resist mask 350 at the position where the fifth resist mask 350 and the oxide mask 370 overlap with each other.

Figure 11C:
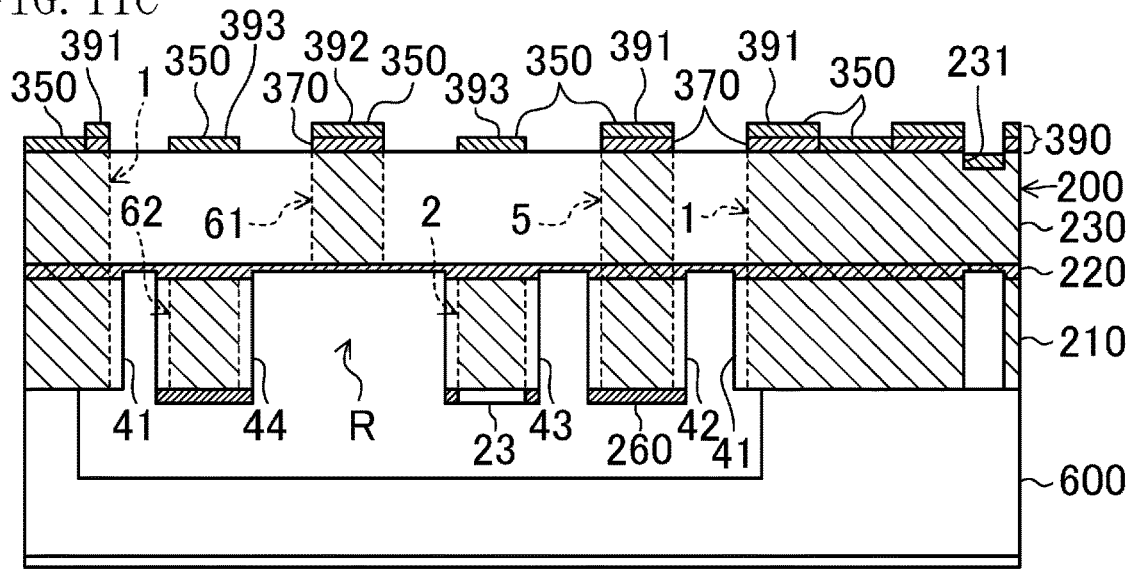

Subsequently, as illustrated in FIG. 11C, a portion of the oxide mask 370 protruding beyond the fifth resist mask 350 is removed by the APS etching. Thus, the oxide mask 370 is formed to have the same shape as that of the fifth resist mask 350 at the position where the oxide mask 370 and the fifth resist mask 350 overlap with each other.

In this manner, the final mask 390 including the oxide mask 370 and the fifth resist mask 350 is formed. The final mask 390 includes a first mask 391 corresponding to the final shape of the first structure, a second mask 392 corresponding to the final shape of the second structure, and a third mask 393 corresponding to the final shape of the third structure. The first mask 391 is formed corresponding to the base 1 and each second hinge 5 on the second silicon layer 230. The second mask 392 is formed corresponding to the fixed inner comb electrode 61 on the second silicon layer 230. The third mask 393 is formed corresponding to the mirror 2 and the movable inner comb electrode 62 on the second silicon layer 230. Moreover, the first mask 391 and the second mask 392 each include the oxide mask 370 formed on the second silicon layer 230, and the fifth resist mask 350 formed on the oxide mask 370. The oxide mask 370 is an example of a lower mask, and the fifth resist mask 350 is an example of an upper mask. On the other hand, the third mask 393 does not include the oxide mask 370, but includes only the fifth resist mask 350. Note that no oxide mask 370 is provided corresponding to the insulation groove 240 of the base 1 and each opening 245a where the common electrode 255 is provided, but only the fifth resist mask 350 is provided corresponding to these portions.

Figure 12A:
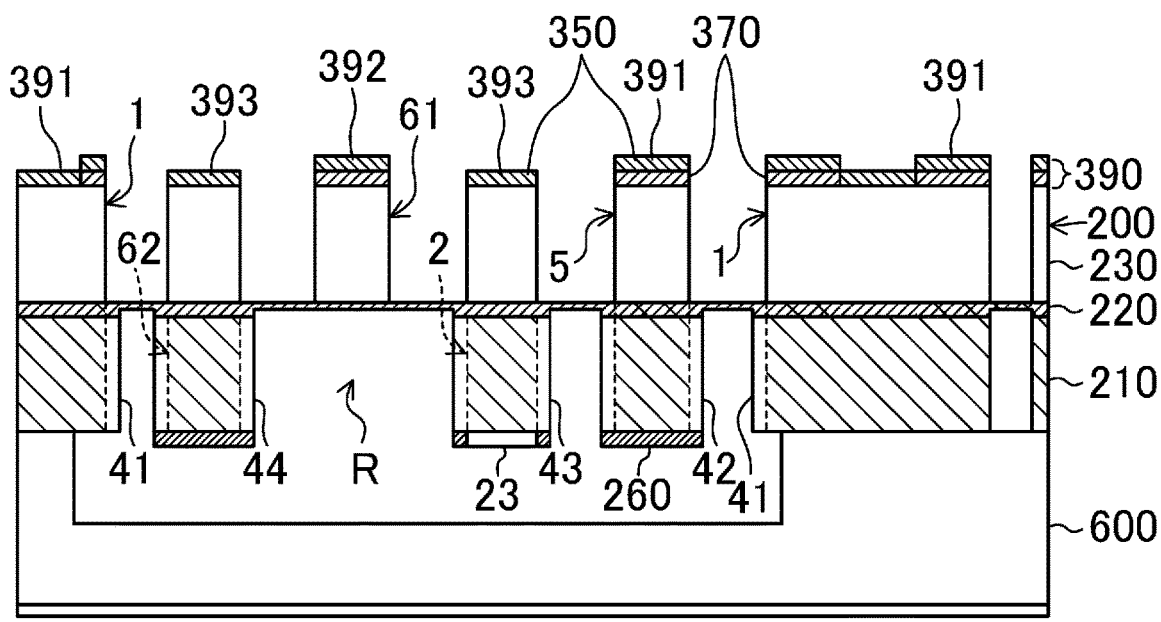
FIGS. 12A and 12B are views of the steps of etching using a final mask.

Next, the second silicon layer 230 and the oxide layer 220 are etched using the final mask 390 (a second etching step). Specifically, the second silicon layer 230 is first ICP-etched as illustrated in FIG. 12A. As a result, a portion of the base 1 formed of the second silicon layer 230 and a portion of each second hinge 5 formed of the second silicon layer 230 are formed. Moreover, the fixed inner comb electrode 61 is formed. Further, a portion of the second silicon layer 230 facing the mirror 2 and the movable inner comb electrode 62 remains.

In this state, the final mask 390 is in the shape corresponding to the final shape of each structure. Thus, the portion of the base 1 formed of the second silicon layer 230, the portion of each second hinge 5 formed of the second silicon layer 230, and the fixed inner comb electrode 61 are formed into the final shapes at this step.

Figure 12B:
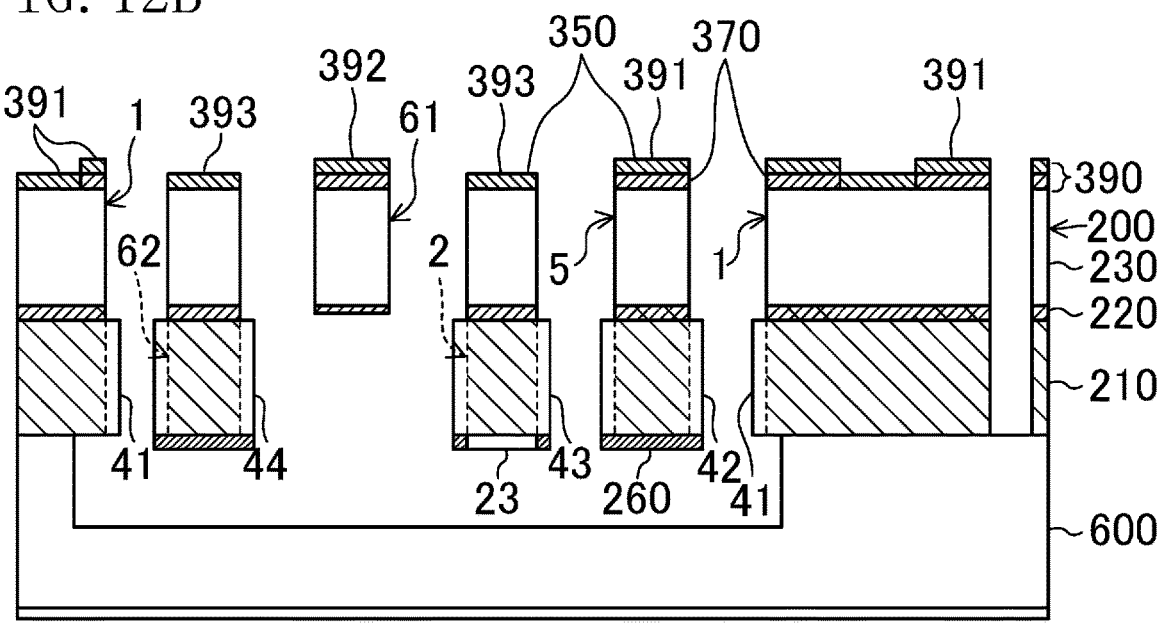

Subsequently, the oxide layer 220 is APS-etched as illustrated in FIG. 12B. As a result, a portion of the oxide layer 220 exposed through the final mask 390 is removed. Of the pre-structures 41 to 44 formed of the first silicon layer 210, the portion protruding beyond the final mask 390 is exposed. Then, the fifth resist mask 350 of the final mask 390 is detached.

Figure 13A:
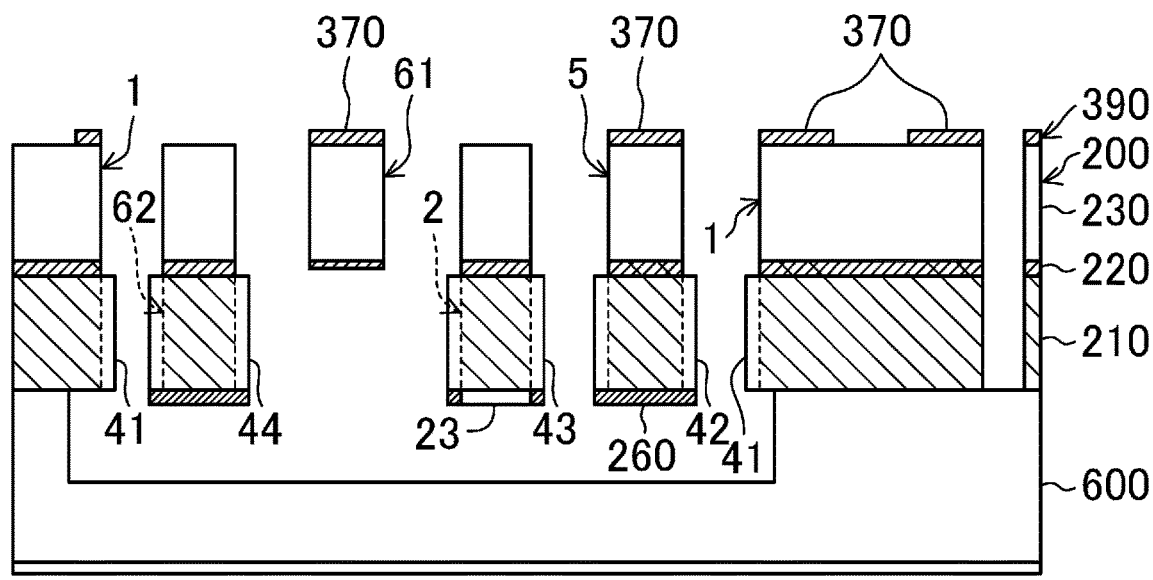
FIGS. 13A and 13B are views of the steps of forming each pre-structure into a corresponding final shape.
Figure 13B:
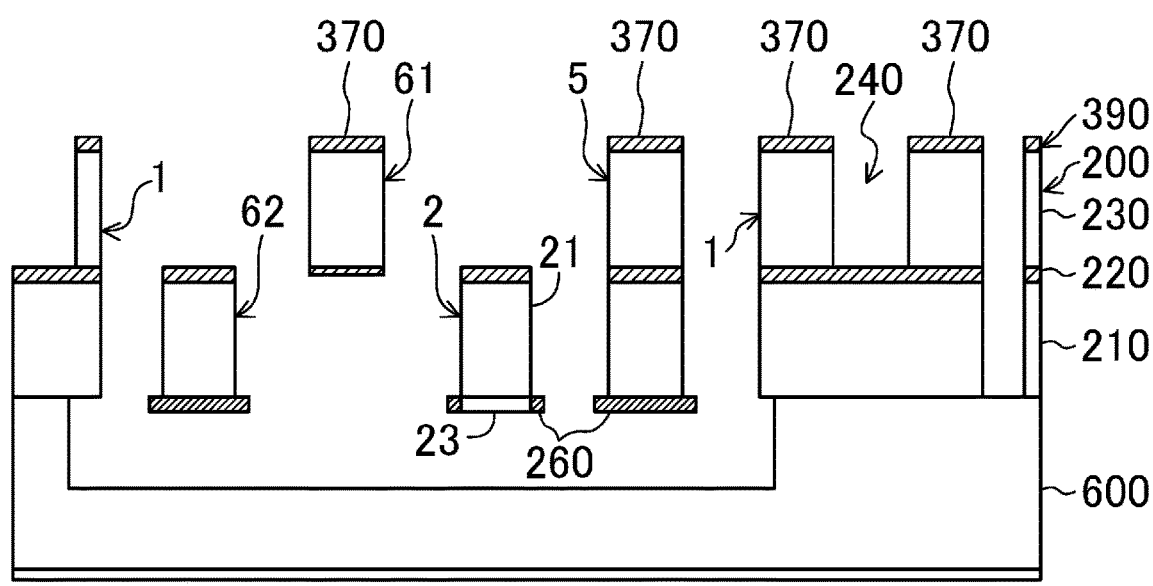

Next, the first silicon layer 210 and the second silicon layer 230 are etched using the oxide mask 370. Specifically, the fifth resist mask 350 is detached such that a portion of the remaining second silicon layer 230 which is not covered by the oxide mask 370, i.e., a portion of the remaining second silicon layer 230 facing the mirror pre-structure 43 and the movable-comb pre-structure 44, is exposed as illustrated in FIG. 13A. In this state, a portion of the second silicon layer 230 corresponding to the insulation groove 240 of the base 1 and to each opening 245a where the common electrode 255 is provided is also exposed. As described above, a portion of the pre-structures 41 to 44 protruding beyond the oxide layer 220 is also exposed. In this state, a portion of the second silicon layer 230 facing the mirror pre-structure 43 and the movable-comb pre-structure 44, a portion of the second silicon layer 230 corresponding to the insulation groove 240 of the base 1 and to each opening 245a, and a portion of the pre-structures 41 to 44 protruding beyond the oxide layer 220 are ICP-etched as illustrated in FIG. 13B. In this state, the oxide layer 220 functions as a mask for etching the pre-structures 41 to 44.

The oxide layer 220 is etched using the final mask 390 at the step of FIG. 12B, and as a result, is formed into the shape similar to that of the final mask 390. That is, since the oxide layer 220 has the shape corresponding to the final shape of each structure, each of the pre-structures 41 to 44 etched at this step is formed into a corresponding one of the final shapes of the structures. Specifically, the base pre-structure 41 is formed into the final shape of a portion of the base 1 formed of the first silicon layer 210. The second-hinge pre-structure 42 is formed into the final shape of a portion of each second hinge 5 formed of the first silicon layer 210. The mirror pre-structure 43 is formed into the final shape of the mirror 2 (the mirror body 21). The movable-comb pre-structure 44 is formed into the final shape of the movable inner comb electrode 62.

Of each of the second hinges 5, the mirror 2, and the movable inner comb electrode 62, the $SiO_2$ film 260 remains in the shape corresponding to the pre-structure, and is not formed into the final shape.

Figure 14:
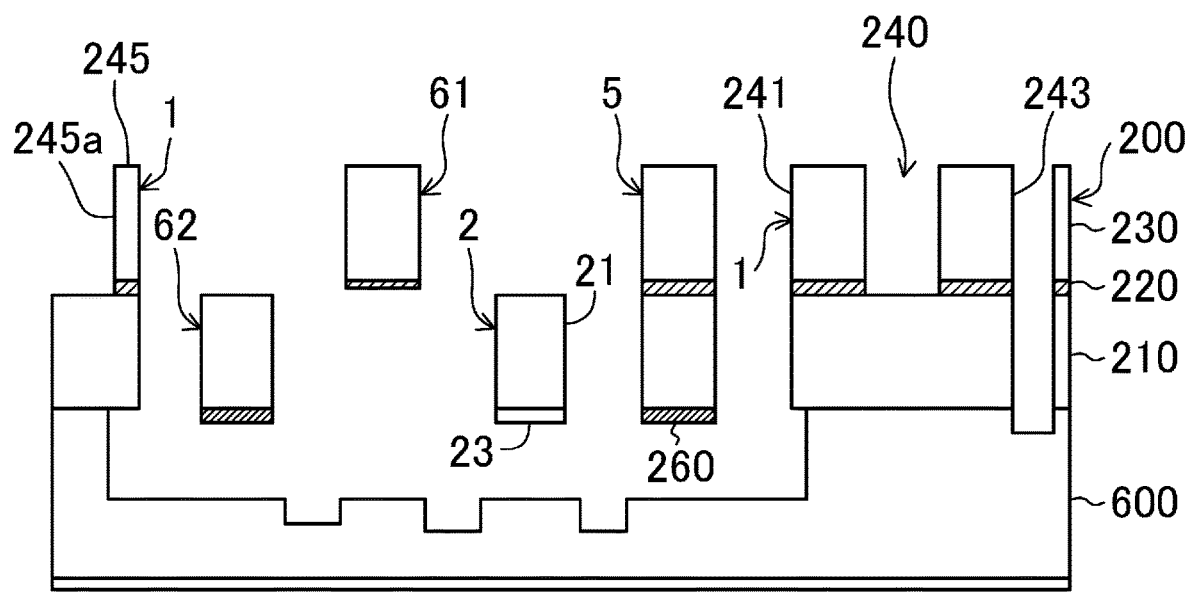
FIG. 14 is a view of the step of removing an unnecessary portion of the oxide layer and the oxide mask.

Next, the oxide mask 370, the oxide layer 220 positioned at the bottoms of the insulation groove 240 and each opening 245a, and the oxide layer 220 provided on the mirror 2 and the movable inner comb electrode 62 are removed by the APS etching as illustrated in FIG. 14.

In this state, the $SiO_2$ film 260 forming the second hinges 5, the mirror 2, and the movable inner comb electrode 62 is also removed and formed into each final shape.

Note that the insulation groove 240 is formed, and therefore, first to fifth regions 241 to 245 are formed at the base 1 (only the first region 241, the third region 243, and the fifth region 245 are illustrated in FIG. 14).

Figure 15:
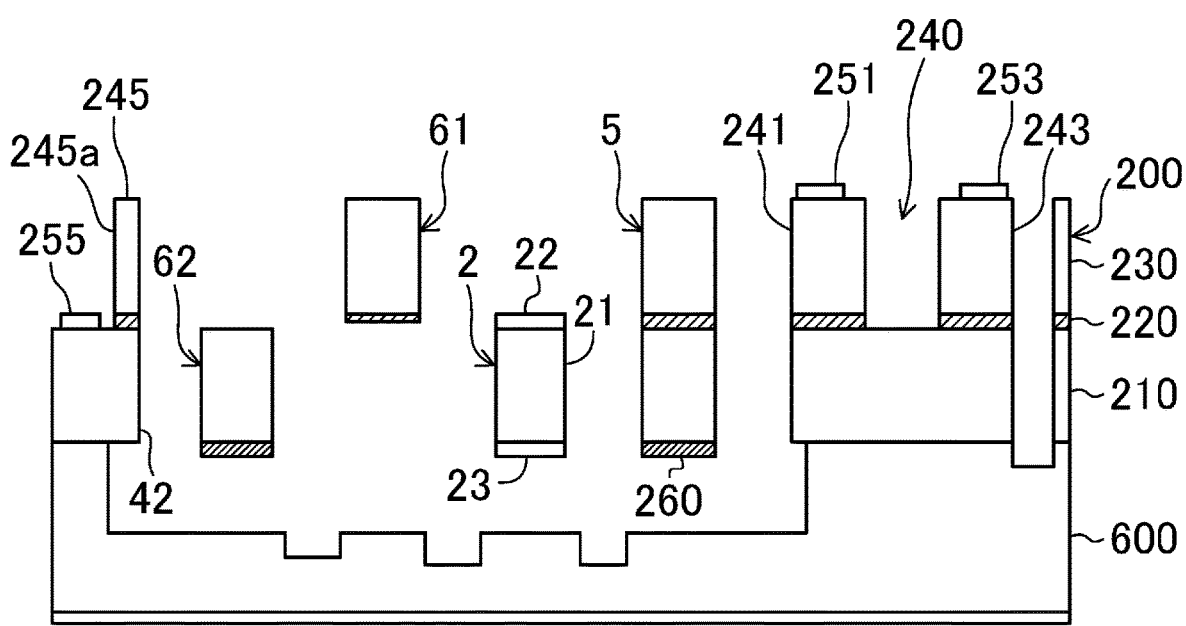
FIG. 15 is a view of the step of wire bonding, and illustrates the step of forming electrodes and a mirrored surface layer.

Subsequently, electrodes and a mirrored surface layer are formed, and wires are connected to the electrodes by wire bonding. Specifically, as illustrated in FIG. 15, an Au/Ti/Pt film is, using a photomask (not shown), formed at a predetermined portion by sputtering, and as a result, electrodes and a mirrored surface layer 22 are formed. In the example of FIG. 15, a first drive electrode 251, a third drive electrode 253, and the common electrode 255 are formed. Moreover, an Au/Ti/Pt film is formed on the surface of the mirror body 21 close to the second silicon layer 230, and as a result, the mirrored surface layer 22 is formed. Subsequently, wire bonding is performed for the first drive electrode 251, the third drive electrode 253, and the common electrode 255 (see FIG. 2).

In this manner, the mirror device 100 is manufactured.

In the manufacturing method including processing of the SOI substrate 200 from each side thereof as described above, alignment between the position in processing of the SOI substrate 200 from one side thereof and the position in processing of the SOI substrate 200 from the other side thereof is important. For example, in the above-described manufacturing method, the first and second alignment marks 211, 231 formed respectively on both sides of the SOI substrate 200 are used so that the position in processing of the SOI substrate 200 from one side thereof and the position in processing of the SOI substrate 200 from the other side thereof can be aligned to each other. However, in some cases, there might be an error between the position in processing of the SOI substrate 200 from one side thereof and the position in processing of the SOI substrate 200 from the other side thereof. For example, after the SOI substrate 200 is processed from the side close to the first silicon layer 210, the position of the final mask 390 might be displaced when the SOI substrate 200 is processed from the side close to the second silicon layer 230. In this case, the position of the structure processed from the side close to the first silicon layer 210 and the position of the structure processed from the side close to the second silicon layer 230 are misaligned from each other in a typical manufacturing method. However, according to the above-described manufacturing method, the structures can be precisely formed even when the position of the final mask 390 is displaced.

Figure 16A:
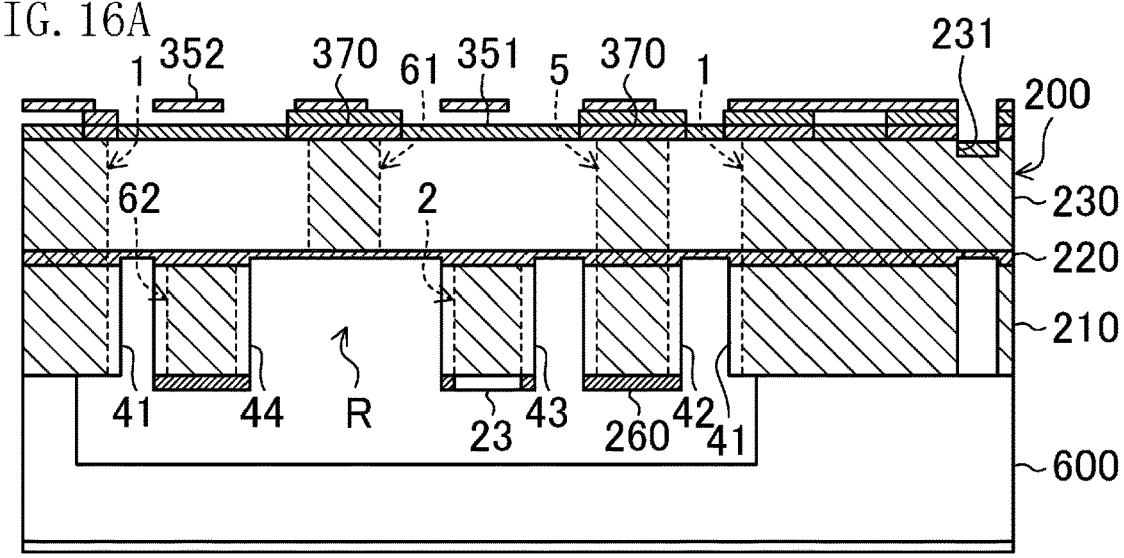
FIGS. 16A to 16C are views for describing displacement of the position of the final mask.
Figure 16B:
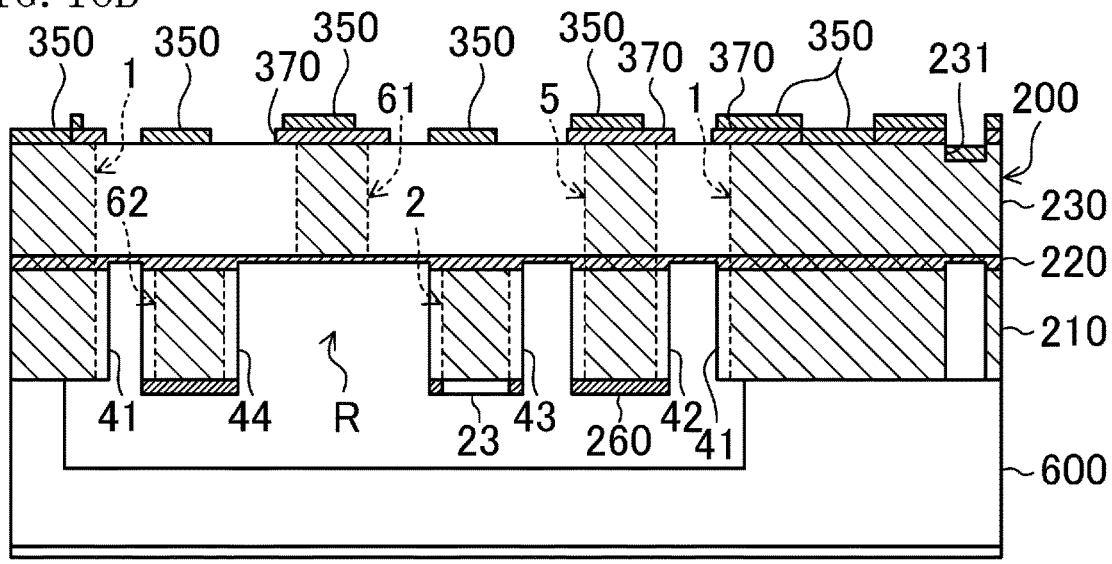
Figure 16C:
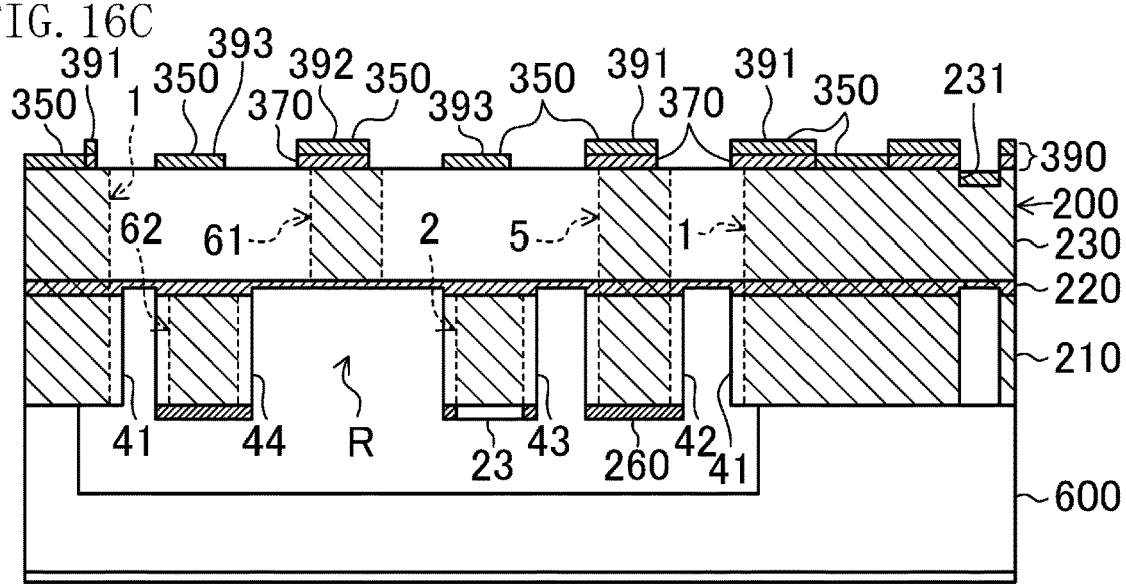

Specifically, when the position of the photomask 352 is displaced as illustrated in FIG. 16A, the position of the fifth resist mask 350 is also displaced as illustrated in FIG. 16B. With displacement of the position of the fifth resist mask 350, the position of the finally-formed final mask 390 is also displaced as illustrated in FIG. 16C. As a result, the portion formed using the final mask 390 is also displaced from a proper position.

Of the base 1 and the second hinges 5 as the first structures, the portion formed of the first silicon layer 210 is first formed. Thus, there is a disadvantage that the position of the portion formed of the first silicon layer 210 is misaligned from the position of the portion formed of the second silicon layer 230.

However, the portion of the first structure formed of the first silicon layer 210 is formed as the pre-structure larger than the final shape when the SOI substrate 200 is processed from the side close to the first silicon layer 210. The first mask 391 of the final mask 390 is, as illustrated in FIG. 16C, formed in the pre-structure as viewed in the thickness direction of the mirror device 100. That is, the size of the pre-structure is set considering the maximum possible positional displacement of the final mask 390. In other words, even with the maximum possible positional displacement of the final mask 390, the first mask 391 is placed in the pre-structure as viewed in the thickness direction of the mirror device 100.

Note that the oxide mask 370 formed before formation of the photomask 352 is, considering the maximum possible positional displacement of the photomask 352, formed larger than the final shape of the oxide mask 370, i.e., the final shape of the final mask 390. Even with displacement of the position of the photomask 352, this prevents the fifth resist mask 350 formed on the oxide mask 370 from protruding beyond the oxide mask 370.

Figure 17A:
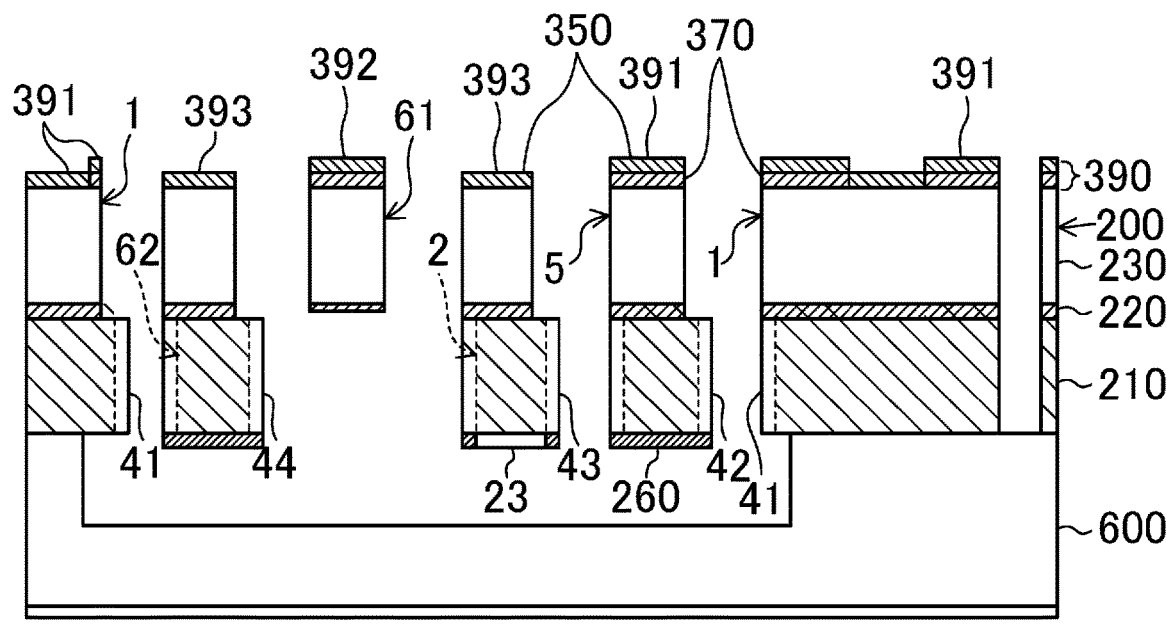
FIGS. 17A and 17B are views of etching using the displaced final mask.
Figure 17B:
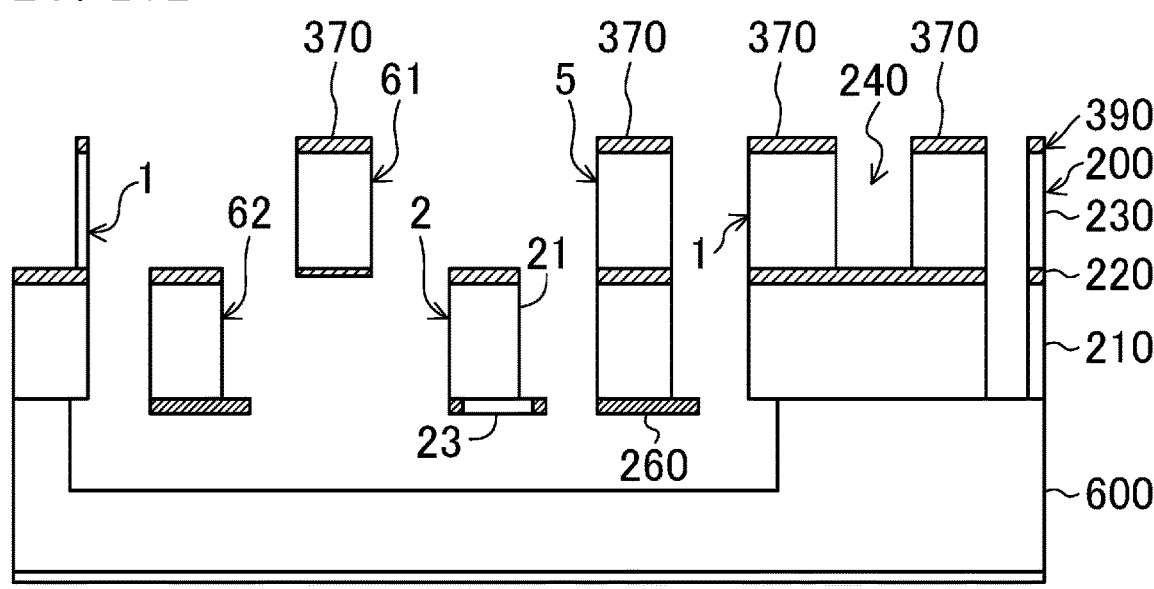

The second silicon layer 230 and the oxide layer 220 are sequentially etched using the first mask 391. As a result, as illustrated in FIG. 17A, a portion of the first structure formed of the second silicon layer 230 is formed into the final shape, and the oxide layer 220 is formed into the final shape. Subsequently, the pre-structure is etched using the oxide layer 220 and the oxide mask 370 of the first mask 391, and as a result, the portion of the first structure formed of the first silicon layer 210 is formed into the final shape.

The portion of the first structure formed of the first silicon layer 210 and the portion of the first structure formed of the second silicon layer 230 are both formed into the final shapes by the displaced final mask 390. As a result, the position of the first structure in the entirety of the mirror device 100 is displaced by displacement of the position of the final mask 390. However, misalignment between the position of the portion of the first structure formed of the first silicon layer 210 and the position of the portion of the first structure formed of the second silicon layer 230 is prevented, and therefore, the first structure can be precisely formed.

For example, if the shape of each second hinge 5 as the first structure is not precise, the spring constant of each second hinge 5 changes, and as a result, the driving performance of the mirror 2 is lowered. That is, with precise formation of each second hinge 5, the accuracy of the spring constant of each second hinge 5 supporting the mirror 2 can be enhanced, and therefore, the driving performance of the mirror 2 can be ensured.

A major factor for displacement of the position of the final mask 390 is displacement of the position of the photomask 352. Displacement of the position of the photomask 352 displaces not only the position of the first mask 391 of the final mask 390 but also the position of the second mask 392 of the final mask 390.

The second structure does not include the first silicon layer 210. Thus, when the second silicon layer 230 is etched using the second mask 392, a portion of the first silicon layer 210 facing the second structure is removed in advance such that the recess R is formed. However, if the second mask 392 is displaced to the position from which the first silicon layer 210 is not removed, the second structure still including the first silicon layer 210 is formed as a result of etching the second silicon layer 230 using the second mask 392.

On the other hand, in the above-described manufacturing method, the second mask 392 is, as illustrated in FIG. 16C, formed in the recess R pre-formed at the first silicon layer 210 as viewed in the thickness direction of the mirror device 100. That is, the recess R is set considering the maximum possible positional displacement of the final mask 390. Thus, even with the maximum possible positional displacement of the final mask 390, the second mask 392 is placed in the recess R as viewed in the thickness direction of the mirror device 100.

Thus, the second structure not including the first silicon layer 210 can be formed in such a manner that the second silicon layer 230 is etched using the second mask 392. That is, the second structure can be precisely formed.

For example, the imprecise shapes of the fixed inner comb electrode 61 and the fixed outer comb electrode 71 as the second structures leads to variation in the positional relationship between the fixed inner comb electrode 61 and the movable inner comb electrode 62 and variation in the positional relationship between the fixed outer comb electrode 71 and the movable outer comb electrode 72. As a result, the driving performance of the mirror 2 is lowered. On the other hand, the fixed inner comb electrode 61 and the fixed outer comb electrode 71 are precisely formed so that the driving performance of the mirror 2 can be ensured.

Further, according to the above-described manufacturing method, the third structure not including the second silicon layer 230 and formed of the first silicon layer 210 is formed into the final shape when the SOI substrate 200 is processed from the side close to the second silicon layer 230. In this manner, even if the positions of the first and second structures in the entirety of the mirror device 100 are displaced due to displacement of the position of the final mask 390, the positional relationship between the third and first structures and the positional relationship between the third and second structures can be maintained. That is, the third structures is, using the final mask 390, formed into the final shape when the SOI substrate 200 is processed from the side close to the second silicon layer 230. With displacement of the position of the final mask 390, the positions of the first to third masks 391 to 393 are also displaced together. For this reason, if the first and second structures are formed at the displaced positions thereof, the third structure is similarly formed at the displaced position thereof. As a result, the positional relationship between the third and first structures and the positional relationship between the third and second structures are maintained. As in the first structure, the first silicon layer 210 is, at the first etching step, formed into the pre-structure formed larger than the final shape of the third structure. Moreover, the third mask 393 is, at the mask formation step, formed in the pre-structure as viewed in the thickness direction of the mirror device 100. In this manner, the third structure can be precisely formed.

For example, the positional relationship between the third and first structures is maintained, and therefore, the frame body 3 forming both of the first and third structures can be formed into a precise shape. Moreover, since the positional relationship between each second hinge 5 as the first structure and the mirror 2 as the third structure is maintained, misalignment of the mirror 2 from the tilting axis can be reduced or prevented. In addition, since the positional relationship between the fixed inner comb electrode 61 as the second structure and the movable inner comb electrode 62 as the third structure is maintained, lowering of the driving performance of the mirror 2 can be reduced or prevented. Similarly, since the positional relationship between the fixed inner comb electrode 61 as the second structure and the movable inner comb electrode 62 as the third structure is maintained, lowering of the driving performance of the mirror 2 can be reduced or prevented.

[Advantageous Effects]

Thus, the above-described method for manufacturing the electronic component includes the first etching step of etching the SOI substrate 200 from the side close to the first silicon layer 210, the mask formation step of forming the final mask 390 on the side of the SOI substrate 200 close to the second silicon layer 230, and the second etching step of etching, using the final mask 390, the SOI substrate 200 from the side close to the second silicon layer 230. The structure includes the first structure, such as the second hinges 5, formed of the first silicon layer 210 and the second silicon layer 230. At the first etching step, a portion of each second hinge 5 formed of the first silicon layer 210 is formed as the second-hinge pre-structure 42 having a larger shape than the final shape. At the mask formation step, the first mask 391 corresponding to the final shape of each second hinge 5 is formed on the side of the SOI substrate 200 close to the second silicon layer 230 in the second-hinge pre-structure 42 as viewed in the thickness direction of the SOI substrate 200. At the second etching step, the second silicon layer 230 and the second-hinge pre-structure 42 are, using the first mask 391, etched to form the final shape of each second hinge 5.

According to the above-described configuration, in the case of processing the SOI substrate 200 from each side thereof, when the SOI substrate 200 is processed from the side close to the first silicon layer 210, the portion formed of the first silicon layer 210 is not processed into the final shape, but is formed into the pre-structure larger than the final shape. When the SOI substrate 200 is processed from the side close to the second silicon layer 230, the second silicon layer 230 and the pre-structure are together processed to form the first structure. Since the shape of the first structure is finally determined at the second etching step, the first structure can be precisely formed even with misalignment between the position in processing of the SOI substrate 200 from the side close to the first silicon layer 210 and the position in processing of the SOI substrate 200 from the side close to the second silicon layer 230. Moreover, since the first mask 391 is placed in the pre-structure as viewed in the thickness direction of the SOI substrate 200, the first structure can be more precisely formed.

The structure includes the second structure, such as the fixed inner comb electrode 61, not including the first silicon layer 210 and formed of the second silicon layer 230. At the first etching step, a portion of the first silicon layer 210 facing the fixed inner comb electrode 61 is etched to form the recess R at the first silicon layer 210. At the mask formation step, the second mask 392 corresponding to the final shape of the fixed inner comb electrode 61 is formed on the side of the SOI substrate 200 close to the second silicon layer 230 in the recess R as viewed in the thickness direction of the SOI substrate 200. At the second etching step, the second silicon layer 230 is, using the second mask 392, etched to form the final shape of the fixed inner comb electrode 61.

According to the above-described configuration, the second structure can be formed at a portion of the second silicon layer 230 from which an opposing portion of the first silicon layer 210 is removed. Thus, the second structure not including the first silicon layer 210 can be formed.

At the mask formation step, the first mask 391 and the second mask 392 are formed using the photomask 352 defining the positional relationship between the first mask 391 and the second mask 392.

According to the above-described configuration, when the position of the photomask 352 is displaced, the positions of the first mask 391 and the second mask 392 are both displaced. As a result, the positional relationship between the first and second structures can be maintained.

The SOI substrate 200 includes the oxide layer 220 provided between the first silicon layer 210 and the second silicon layer 230. The structure includes the third structure, such as the mirror 2 and the movable inner comb electrode 62, not including the second silicon layer 230 and formed of the first silicon layer 210. At the first etching step, a portion of the mirror 2 formed of the first silicon layer 210 and a portion of the movable inner comb electrode 62 formed of the first silicon layer 210 are formed as the mirror pre-structure 43 and the movable-comb pre-structure 44 having a larger shape than the final shapes. At the mask formation step, the third mask 393 corresponding to the final shapes of the mirror 2 and the movable inner comb electrode 62 is formed on the side of the SOI substrate 200 close to the second silicon layer 230 in the mirror pre-structure 43 and the movable-comb pre-structure 44 as viewed in the thickness direction of the SOI substrate 200. At the second etching step, the second silicon layer 230 and the oxide layer 220 are, using the third mask 393, etched such that a portion of the oxide layer 220 on the mirror pre-structure 43 and the movable-comb pre-structure 44 is formed into the shape corresponding to the final shapes of the mirror 2 and the movable inner comb electrode 62. Then, the third mask 393 is detached, and the mirror pre-structure 43 and the movable-comb pre-structure 44 are, using a portion of the oxide layer 220 remaining on the mirror pre-structure 43 and the movable-comb pre-structure 44, etched to form the final shapes of the mirror 2 and the movable inner comb electrode 62.

According to the above-described configuration, even the third structure not including the second silicon layer 230 is determined by the second etching step of processing the SOI substrate 200 from the side close to the second silicon layer 230. As in the first structure, the third structure can be precisely formed in such a manner that the first silicon layer 210 is, at the first etching step, formed into the pre-structure having a larger shape than the final shape of the third structure and that the third mask 393 is, at the mask formation step, formed in the pre-structure as viewed in the thickness direction of the mirror device 100.

For the substrate configured such that another layer (the oxide layer 220) is interposed between the first silicon layer 210 and the second silicon layer 230 as described above, it might be required that the substrate is processed from each side thereof. In this case, the above-described manufacturing method is effective, and each structure can be precisely formed.

Each of the first and second masks 391, 392 includes the oxide mask 370 formed on the second silicon layer 230, and the fifth resist mask 350 formed on the oxide mask 370. At the second etching step, the second silicon layer 230 and the oxide layer 220 are, using the fifth resist masks 350 of the first and second masks 391, 392 and the third mask 393, etched such that a portion of the first structure formed of the second silicon layer 230 and the oxide layer 220 and the second structure are formed into the final shapes thereof and that a portion of the second silicon layer 230 and the oxide layer 220 on the third pre-structure is formed into the shape corresponding to the final shape of the third structure. Then, the fifth resist masks 350 of the first and second masks 391, 392 and the third mask 393 are detached, and a portion of the second silicon layer 230 on the mirror pre-structure 43 and the movable-comb pre-structure 44, the mirror pre-structure 43, and the movable-comb pre-structure 44 are, using the oxide masks 370 of the first and second masks 391, 392 and a portion of the oxide layer 220 remaining on the third structure, etched to form the final shape of the first structure and the final shape of the third structure.

According to the above-described configuration, in the case of the substrate including the first silicon layer 210, the oxide layer 220, and the second silicon layer 230, the third structure is formed using the oxide layer 220 as a mask at the second etching step. Since each of the first and second masks 391, 392 has the double structure of the oxide mask 370 and the fifth resist mask 350, the oxide layer 220 can be formed into a desired shape, and can be used as a mask.

At the mask formation step, the first mask 391, the second mask 392, and the third mask 393 are formed using the photomask 352 defining the positional relationship among the first mask 391, the second mask 392, and the third mask 393.

According to the above-described configuration, if the position of the photomask 352 is displaced, the positions of the first mask 391, the second mask 392, and the third mask 393 are also displaced. As a result, the positional relationship between the first and third structures can be maintained, and the positional relationship between the second and third structures can be maintained.

The mirror device 100 includes the frame body 3, the mirror 2 configured to tilt about the Y-axis with respect to the frame body 3, the fixed inner comb electrode 61 including the plurality of electrode fingers 63 arranged in the arrangement direction along the Y-axis and provided at the frame body 3, and the movable inner comb electrode 62 including the plurality of electrode fingers 64 arranged in the arrangement direction and provided at the mirror 2, the electrodes fingers 63, 64 of the fixed inner comb electrode 61 and the movable inner comb electrode 62 being alternately arranged. The mirror 2 includes the mirror body 21 and the extension 65 extending from the mirror body 21. Some of the electrode fingers 64 of the movable inner comb electrode 62 are provided at the mirror body 21, and another electrode fingers 64 of the movable inner comb electrode 62 are provided at the extension 65.

According to the above-described configuration, the total area where the fixed inner comb electrode 61 and the movable inner comb electrode 62 face each other can be increased. For example, an increase in the length of the electrode fingers 63, 64 can also increase the total area where the fixed inner comb electrode 61 and the movable inner comb electrode 62 face each other. However, a longer length of the electrode fingers 63, 64 results in a smaller tilting angle of the mirror 2. That is, when the greatest electrostatic attractive force is generated, the area where the electrode fingers 63, 64 face each other (i.e., the area where the electrode fingers 63, 64 overlap with each other as viewed in the Y-axis direction) is the largest, and the tilting angle of the mirror 2 is the greatest. Moreover, a longer length of the electrode fingers 63, 64 results in a smaller angle of tilting of the electrode fingers 64 from the state of the electrode fingers 63, 64 being displaced from each other in the Z-axis direction to the state of the largest area where the electrode fingers 63, 64 face each other. That is, a longer length of the electrode fingers 63, 64 results in a smaller tilting extent of the mirror 2. Moreover, since each of the electrode fingers 63, 64 is elongated, an increase in the length of the electrode fingers 63, 64 leads to a problem in the strength of the electrode fingers 63, 64. On the other hand, the extension 65 extends from the mirror body 21, and the electrode fingers 64 are provided not only at the mirror body 21 but also at the extension 65. Thus, the number of electrode fingers 64 is increased. According to such a configuration, the total area where the fixed inner comb electrode 61 and the movable inner comb electrode 62 face each other can be increased without decreasing the tilting extent of the mirror 2. Further, the length of the electrode fingers 64 is not necessarily increased. This prevents an increase in the dimensions of the mirror device 100 in the direction in which the electrode fingers 64 extend, i.e., in the X-axis direction. In particular, the outer drive electrode 7 is provided outside the frame body 3 in the X-axis direction in the mirror device 100, and the mirror device 100 is relatively elongated in the X-axis direction. That is, the above-described configuration can prevent a further increase in the length of the mirror device 100 in the X-axis direction.

Further, even if the portion of the mirror body 21 provided with the electrode fingers 64 is small, the number of electrode fingers 64 can be increased by the extension 65. That is, since the mirror body 21 is in the circular shape, the portion of the mirror body 21 provided with the electrode fingers 64 is in an arc shape. Thus, if the electrode fingers 64 can be positioned close to the Y-axis, the portion of the mirror body 21 provided with the electrode fingers 64 can be enlarged. However, in order to ensure drive force, a certain distance between the Y-axis and each electrode finger 64 needs to be ensured, and the portion of the mirror body 21 provided with the electrode fingers 64 cannot be much enlarged. Even in the case where there are limitations on the portion of the mirror body 21 provided with the electrode fingers 64, the number of electrode fingers 64 can be increased by the extension 65.

The mirror device 100 further includes two first hinges 4 arranged on the Y-axis to sandwich the mirror 2 and connecting between the mirror 2 and the frame body 3. The extension 65 extends in the arrangement direction of the electrode fingers 64.

According to the above-described configuration, the first hinges 4 are arranged outside the mirror 2, and the frame body 3 is disposed outside the first hinges 4, as viewed in the Y-axis direction. That is, the space where the first hinges 4 are arranged is formed between the mirror 2 and the frame body 3. The extension 65 extends from the mirror body 21 in the arrangement direction of the electrode fingers 64, i.e., in the Y-axis direction. That is, the extension 65 extends in the space formed between the mirror 2 and the frame body 3 so that the first hinges 4 can be arranged. Thus, even if the extension 65 is provided, an increase in the dimensions of the mirror device 100 in the Y-axis direction can be reduced.

With an extremely-long extension 65, the stiffness of each second hinge 5 needs to be high, and therefore, the drive force of the outer drive electrode 7 needs to be high. In order to increase the drive force of the outer drive electrode 7, the number of electrode fingers 73, 74 needs to be increased, and for this reason, the dimensions of the mirror device 100 are increased in the X-axis direction. On the other hand, the length of the extension 65 in the Y-axis direction is set to such a length that the extension 65 does not protrude beyond end portions of the first hinges 4 on the side close to the frame body 3. This reduces enlargement of the frame body 3, and therefore, reduces an increase in the dimensions of the mirror device 100 in the X-axis direction.

Moreover, all of the electrode fingers 64 are not provided at the extension 65, but some of the electrode fingers 64 are provided at the mirror body 21. Thus, the drive force of the inner drive electrode 6 can be efficiently transmitted to the mirror 2. That is, the drive force generated by the electrode fingers 64 provided at the extension 65 can be, to some extent, absorbed by the extension 65 while being transmitted to the mirror body 21 via the extension 65. On the other hand, the drive force generated by the electrode fingers 64 provided at the mirror body 21 directly acts on the mirror body 21, and therefore, no loss is caused in transmission of the drive force via the extension 65. Further, if the extension 65 is provided at the position (the position where the outer peripheral edge of the mirror body 21 intersects the X-axis in FIG. 1) as the tangent to the mirror body 21, the dimensions of the mirror device 100 are increased in the X-axis direction. In the mirror device 100, the outer drive electrode 7 is provided on the side of the second and fourth side portions 32, 34 of the frame body opposite to the electrode fingers 63. Thus, the dimensions of the mirror device 100 in the direction in which the electrode fingers 63, 64 extend is relatively large. As described above, the extension 65 is not provided at the position as the tangent to the mirror body 21, but is provided at the position slightly shifted from the intersection between the outer peripheral edge of the mirror body 21 and the X-axis toward the intersection between the outer peripheral edge of the mirror body 21 and the Y-axis. Thus, an increase in the dimensions of the mirror device 100 in the X-axis direction can be reduced.

The portion of the mirror body 21 provided with the electrode fingers 64 of the movable inner comb electrode 62 curves or bends to be raised outward, and each electrode finger 64 provided at the mirror body 21 is shorter than each electrode finger 64 provided at the extension 65.

That is, the portion of the mirror body 21 provided with the electrode fingers 64 of the movable inner comb electrode 62 curves or bends to be raised outward. Thus, if the length of each electrode finger 64 provided at the mirror body 21 and the length of each electrode finger 64 provided at the extension 65 are equal to each other, the electrode fingers 64 provided at the mirror body 21 protrude outward. On the other hand, since the electrode fingers 64 provided at the mirror body 21 are shorter than the electrode fingers 64 provided at the extension 65, outward protrusion of the electrode fingers 64 provided at the mirror body 21 can be reduced.

The line connecting the tip ends of the electrode fingers 64 of the movable inner comb electrode 62 is parallel with the Y-axis.

That is, not only the tip ends of the electrode fingers 64 provided at the mirror body 21 but also the tip ends of the electrode fingers 64 provided at the extension 65 are positioned on the line parallel to the Y-axis.

Each electrode finger 64 provided at the extension 65 is thicker than each electrode finger 64 provided at the mirror body 21.

As described above, each electrode finger 64 provided at the extension 65 is longer than each electrode finger 64 provided at the mirror body 21. Thus, the electrode fingers 64 provided at the extension 65 are reinforced in such a manner that the thickness of such electrode fingers 64 is increased.

Of the electrode fingers 64 provided at the extension 65, the electrode finger 64 provided on the outermost end side of the extension 65 faces the frame body 3. The portion of the frame body 3 facing the electrode finger 64 provided on the outermost end side of the extension 65 functions as the electrode finger 63 of the fixed inner comb electrode 61.

That is, the portion of the frame body 3 facing the electrode finger 64 provided on the outermost end side of the extension 65 is formed of the first silicon layer 210, the oxide layer 220, and the second silicon layer 230. The portion of the frame body 3 formed of the second silicon layer 230 is in electrical conduction with the electrode fingers 63. Thus, when drive voltage is applied to the fixed inner comb electrode 61, the drive voltage is also applied to the second silicon layer 230 at the portion of the frame body 3 facing the electrode finger 64 provided on the outermost end side of the extension 65. Then, such a portion functions as the electrode finger 63, and electrostatic attractive force is generated between this portion of the frame body 3 and the electrode finger 64 provided on the outermost end side of the extension 65.

<<Other Embodiments>>

The embodiments have been described above as example techniques of the present disclosure. However, the techniques of the present disclosure are not limited to the embodiments described above, and are applicable to embodiments to which modifications, substitutions, additions, or omissions are made. Moreover, the components described in the above-described embodiments may be combined into another embodiment. Elements illustrated in the attached drawings or the detailed description may include not only essential elements for solving the problem, but also non-essential elements for solving the problem in order to illustrate the above-described techniques. Thus, the mere fact that those non-essential elements are shown in the attached drawings or the detailed description should not be interpreted as requiring that such elements be essential.

The above-described embodiments may have the following configurations.

The mirror device 100 is an example of an electronic device, and the electronic device to which the above-described manufacturing method is applicable is not limited to the mirror device 100. Moreover, the configuration of the mirror device 100 has been set forth merely as an example, and the present disclosure is not limited to such a configuration. Further, the first to third structures have been set forth merely as examples.

In the above-described manufacturing method, etching and film formation has been specifically described, but the present disclosure is not limited to such etching and film formation. That is, as long as the above-described manufacturing method can be implemented, the type of etching is not limited, and the film formation method is not limited. Moreover, the resist mask may be a positive resist or a negative resist. The materials and shapes described in the above-described embodiments have been set forth as examples, and the present disclosure is not limited to such materials and shapes.

In the above-described manufacturing method, the SOI substrate is used as a substrate, but the present disclosure is not limited to the SOI substrate. As long as a substrate includes two or more layers, the above-described manufacturing method is applicable to such a substrate.

As long as an electronic component can be manufactured, the order of the steps of the above-described manufacturing method may be changed, or any of the steps of the above-described manufacturing method may be skipped.

In the above-described embodiments, manufacturing of the electronic component in the case where the position of the final mask 390 is displaced due to positional displacement caused when the photomask 352 is placed using the second alignment mark 231 has been described. However, the mechanism of causing positional displacement is not limited to this case. With a change in the method for forming the final mask 390, the mechanism of causing positional displacement of the final mask 390 also changes, for example. The above-described manufacturing method is not limited to the method for forming the final mask 390 and the mechanism of causing positional displacement of the final mask 390. The above-described manufacturing method is broadly effective against misalignment between the position in processing of the substrate from one side thereof and the position in processing of the substrate from the other side thereof.

Figure 18:
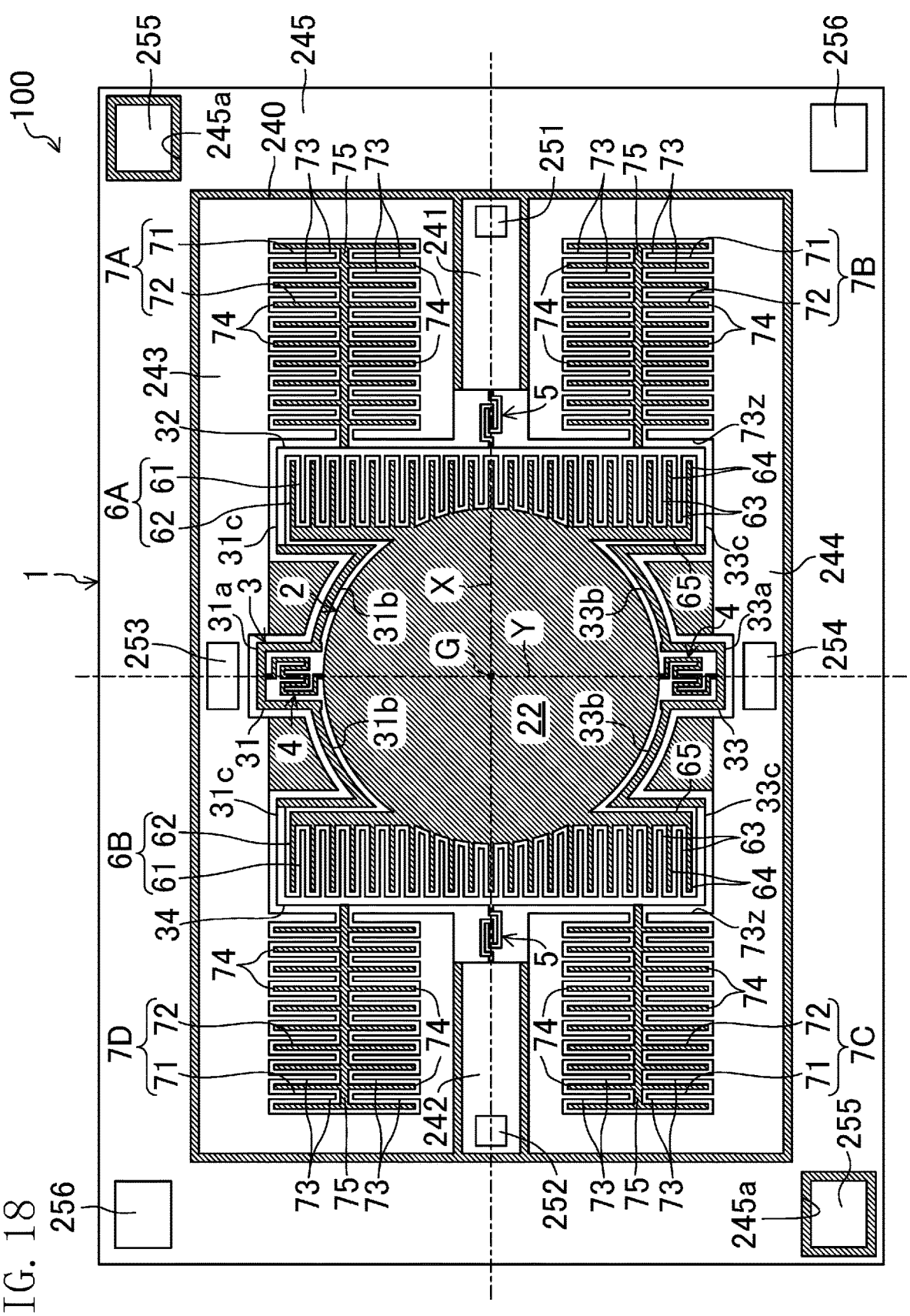
FIG. 18 is a plan view of a mirror device of a variation.

In the mirror device 100, the frame body 3 is formed in the subsequently square shape. However, the present disclosure is not limited to such a shape. For example, as illustrated in FIG. 18, the frame body 3 may be formed in the shape surrounding the first hinges 4 and formed along the outer shape of the mirror 2. Specifically, the first side portion 31 of the frame body 3 includes a rectangular portion 31a surrounding the first hinge 4, arc portions 31b formed along the outer shape of the mirror 2, and L-shaped portions 31c each formed along the extension 65 and the electrode finger 64. Similarly, the third side portion 33 includes a rectangular portion 33a surrounding the first hinge 4, arc portions 33b formed along the outer shape of the mirror 2, and L-shaped portions 33c each formed along the extension 65 and the electrode finger 64. A large space is formed around the first hinges 4 in the mirror device 100 illustrated in FIG. 1. On the other hand, in a mirror device 2100 illustrated in FIG. 18, the space around the first hinges 4 is smaller due to the rectangular portions 31a, 33a each surrounding a corresponding one of the first hinges 4, and therefore, the first hinges 4 are positioned close to the frame body 3. Since the structures are arranged close to the first hinges 4 as described above, the first hinges 4 can be precisely formed in etching. That is, in the case where no structure is present close to the first hinges 4 and a large space is formed around the first hinges 4, the first hinges 4 are easily cut out by etching, and tend to be formed thinner as compared to a design value. On the other hand, the rectangular portions 31a, 33a are arranged close to the first hinges 4. This can suppress the first hinges 4 from being extremely thin.

Note that in the mirror device 2100, a portion of the base 1 protrudes inward according to the inwardly-recessed shape of a portion (specifically, the arc portion 31b) of each of the first side portion 31 and the third side portion 33. Specifically, a protrusion 11 protruding toward the mirror 2 is provided at a portion of the base 1 corresponding to each arc portion 31b. The base 1 is basically formed of the first silicon layer 210, the oxide layer 220, and the second silicon layer 230, but each protrusion 11 is formed only of the first silicon layer 210. That is, the protrusion 11 is more recessed in the thickness direction of the base 1 as compared to other portion of the base 1. When the Au/Ti/Pt film is formed on the mirror body 21, there is a probability that the Au/Ti/Pt film is also formed on a portion of the base 1 close to the mirror body 21. Thus, the Au/Ti/Pt film might be formed on each protrusion 11. The third drive electrode 253 is provided at the base 1, and electrical conduction between the third drive electrode 253 and an unintended portion due to the Au/Ti/Pt film formed on the base 1 is not preferable. For this reason, each protrusion 11 is formed only of the first silicon layer 210, and therefore, is electrically insulated from a portion of the base 1 provided with the third drive electrode 253. Thus, even if the Au/Ti/Pt film is formed on each protrusion 11, electrical conduction between the third drive electrode 253 and the unintended portion can be prevented.

What is claimed is:

1. A semiconductor comprising:
   a base;
   a first tilting portion configured to tilt about a first tilting axis with respect to the base;
   a first fixed comb electrode including a plurality of electrode fingers and provided at the base;
   a first movable comb electrode including a plurality of electrode fingers and provided at the first tilting portion, the electrode fingers of the first fixed comb electrode and the first movable comb electrode being alternately arranged;
   a second tilting portion configured to tilt about a second tilting axis with respect to the first tilting portion, the second tilting axis intersecting the first tilting axis;
   a second fixed comb electrode including a plurality of electrode fingers and provided at the first tilting portion;
   a second movable comb electrode including a plurality of electrode fingers and provided at the second tilting portion, the electrode fingers of the second fixed comb electrode and the second movable comb electrode being alternately arranged;
   a first connection portion connecting the first tilting portion to the base so that the first tilting portion is able to tilt with respect to the base; and
   a second connection portion connecting the second tilting portion to the first tilting portion so that the second tilting portion is able to tilt with respect to the first tilting portion, wherein
   the first connecting portion includes a first silicon layer and a second silicon layer stacked one after another in a thickness direction of the base with an insulating layer interposed therebetween,
   the second fixed comb electrode is in electrical conduction with a drive electrode provided for the base via the second silicon layer of the first connecting portion, and the first movable comb electrode is in electrical conduction with a common electrode provided for the base via the first silicon layer of the first connecting portion,
   the first tilting portion includes a first extension extending in a direction along the first tilting axis, and
   the first movable comb electrode is provided at the first extension.

2. The semiconductor device of claim 1, further comprising:
the second connection portion includes at least two second tilting portions,
wherein the at least two second connection portions are arranged on the second tilting axis to sandwich the second tilting portion, and
the first extension is, in a direction along the second tilting axis, disposed between a portion where one of the at least two second connection portions is connected to the first tilting portion and a portion where the other second connection portion is connected to the first tilting portion.

3. The semiconductor device of claim 1, wherein
the first tilting portion includes a frame body including at least two pairs of opposing side portions and surrounding the second tilting portion.

4. The semiconductor device of claim 3, wherein
one of the at least two pairs of opposing side portions extends in a direction along the second tilting axis,
the first extension includes at least two first extensions provided at each side portion of the pair extending in the direction along the second tilting axis, and
the at least two first extensions provided at each side portion of the pair extending in the direction along the second tilting axis are arranged respectively on both sides of the first tilting axis.

5. The semiconductor device of claim 1, wherein
the second tilting portion includes a body and a second extension extending from the body,
some of the electrode fingers of the second movable comb electrode are provided at the body, and another electrode fingers of the second movable comb electrode are provided at the second extension,
a portion of the body provided with the electrode fingers of the second movable comb electrode curves or bends to be raised outward, and
each electrode finger of the second movable comb electrode provided at the body is shorter than each electrode finger of the second movable comb electrode provided at the second extension.

6. The semiconductor device of claim 5, wherein
each electrode finger of the second movable comb electrode provided at the second extension is thicker than each electrode finger of the second movable comb electrode provided at the body.

7. The semiconductor device of claim 1, wherein
the first tilting axis is perpendicular to the second tilting axis, and
a distance between the first tilting axis and a farthest portion of each electrode finger of the first movable comb electrode from the first tilting axis is equal to a distance between the second tilting axis and a farthest portion of each electrode finger of the second movable comb electrode from the second tilting axis.

8. The semiconductor device of claim 1, wherein
the first movable comb electrode further includes a plurality of electrode fingers extending from the first extension toward both sides along a direction of the second tilting axis of the second tilting portion.

9. The semiconductor device of claim 1, wherein
the second silicon layer is removed from the first and second movable comb electrodes, the first and second movable comb electrodes being in electrical conduction with the common electrode via the first silicon layer of the first connection portion,
the first silicon layer is removed from the first and second fixed comb electrodes, and
the second fixed comb electrode is in electrical conduction with the drive electrode via the second silicon layer of the first connecting portion.

* * * * *